United States Patent
Wu

(10) Patent No.: US 11,942,521 B2
(45) Date of Patent: Mar. 26, 2024

(54) EPITAXIAL LAYERS WITH DISCONTINUED ALUMINIUM CONTENT FOR III-NITRIDE SEMICONDUCTOR

(71) Applicant: INNOSCIENCE (SUZHOU) SEMICONDUCTOR CO., LTD., Suzhou (CN)

(72) Inventor: Peng-Yi Wu, Zhuhai (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 569 days.

(21) Appl. No.: 17/266,120

(22) PCT Filed: Dec. 30, 2020

(86) PCT No.: PCT/CN2020/141382
§ 371 (c)(1),
(2) Date: Feb. 5, 2021

(87) PCT Pub. No.: WO2022/141190
PCT Pub. Date: Jul. 7, 2022

(65) Prior Publication Data
US 2022/0376057 A1    Nov. 24, 2022

(51) Int. Cl.
*H01L 21/00* (2006.01)
*H01L 21/02* (2006.01)
(Continued)

(52) U.S. Cl.
CPC ...... *H01L 29/267* (2013.01); *H01L 21/02381* (2013.01); *H01L 21/02433* (2013.01);
(Continued)

(58) Field of Classification Search
CPC ......... H01L 21/02381; H01L 21/02433; H01L 21/02458; H01L 21/02505;
(Continued)

(56) References Cited

U.S. PATENT DOCUMENTS

2003/0136333 A1    7/2003  Semond et al.
2009/0200645 A1    8/2009  Kokawa et al.
(Continued)

FOREIGN PATENT DOCUMENTS

CN    103515419 A    1/2014
CN    103839979 A    6/2014
(Continued)

OTHER PUBLICATIONS

Nepal et al., "Temperature and compositional dependence of the energy band gap of AlGaN alloys", 2005, Applied Physics Letters, Vo. 87, pp. 242104-1-242104-3, published Dec. 7, 2005.*
(Continued)

*Primary Examiner* — Nikolay K Yushin
(74) *Attorney, Agent, or Firm* — JCIPRNET

(57) ABSTRACT

The present invention provides a semiconductor device, comprising: a substrate (10); a stack of III-nitride transition layers (11) disposed on the substrate (10), the stack of III-nitride transition layers (11) maintaining an epitaxial relationship to the substrate (10); a first III-nitride layer (121) disposed on the stack of III-nitride transition layers (11); and a second III-nitride layer (122) disposed on the first III-nitride layer (121), the second III-nitride layer (122) having a band gap energy greater than that of the first III-nitride layer (121), wherein the stack of III-nitride transition layers (11) comprises a first transition layer (111), a second transition layer (112) on the first transition layer (111), and a third transition layer (113) on the second transition layer (112), and wherein the second transition layer (112) has a minimum aluminium molar ratio among the first transition layer (111), the second transition layer (112) and third transition layer (113). The present invention also relates to a method of forming such semiconductor device. The semiconductor device according to the present (Continued)

invention advantageously has a dislocation density less than or equal to $1\times10^9$ cm$^{-2}$ in the first III-nitride layer (121).

18 Claims, 16 Drawing Sheets

(51) Int. Cl.
*H01L 29/00* (2006.01)
*H01L 29/04* (2006.01)
*H01L 29/15* (2006.01)
*H01L 29/267* (2006.01)
*H01L 29/778* (2006.01)

(52) U.S. Cl.
CPC .. *H01L 21/02458* (2013.01); *H01L 21/02505* (2013.01); *H01L 21/02516* (2013.01); *H01L 21/0254* (2013.01); *H01L 29/045* (2013.01); *H01L 29/155* (2013.01); *H01L 29/7786* (2013.01); *H01L 21/0262* (2013.01); *H01L 21/02631* (2013.01)

(58) Field of Classification Search
CPC ........... H01L 21/02516; H01L 21/0254; H01L 21/0262; H01L 21/02631; H01L 29/267; H01L 29/045; H01L 29/155; H01L 29/7786; H01L 21/02; H01L 21/02507; H01L 29/04; H01L 29/154; H01L 29/15; H01L 29/778; H01L 29/2003; H01L 29/20; H01L 29/402; H01L 29/40; H01L 29/205; H01L 29/66462
See application file for complete search history.

(56) References Cited

U.S. PATENT DOCUMENTS

| | | |
|---|---|---|
| 2011/0272665 A1 | 11/2011 | Yamaguchi et al. |
| 2012/0153351 A1 | 6/2012 | Chandolu et al. |
| 2012/0187540 A1 | 7/2012 | Hooper et al. |
| 2022/0140123 A1* | 5/2022 | Yeh ................ H01L 21/02658 257/76 |

FOREIGN PATENT DOCUMENTS

| | | |
|---|---|---|
| CN | 104126223 A | 10/2014 |
| CN | 105762061 A | 7/2016 |
| JP | 2012174705 A | 9/2012 |

OTHER PUBLICATIONS

Notice of Allowance of corresponding China patent application No. 202080006330.5 dated Aug. 3, 2022.
International Search Report and Written Opinion of the corresponding PCT application No. PCT/CN2020/141382 dated Sep. 28, 2021.

\* cited by examiner

EPITAXIAL LAYERS WITH DISCONTINUED ALUMINIUM CONTENT FOR III-NITRIDE SEMICONDUCTOR

BACKGROUND

1. Technical Field

The present invention relates to a semiconductor device and a manufacturing method thereof, and particularly to a semiconductor device with a Group-III nitride (hereinafter referred to as "III-nitride") layer, two-dimensional electron gas (hereinafter referred to as "2DEG"), conductor structures, and metal layers. In particular, the present invention further relates to the epitaxial structure suitable for generating strain in the III-nitride layers of a semiconductor device.

2. Description of the Related Art

It is well-understood that gallium nitride (GaN) power electronics offer great promise to extend power levels and switching frequencies beyond the capabilities of silicon. However, due to the large lattice constant and thermal expansion coefficient (TEC) mismatch between III-nitrides and a substrate, GaN growth techniques are quite different from those typically employed for conventional arsenide-based or silicon (Si)-Germanium (Ge) epitaxy. If not appropriately managed, stresses from these material differences can lead to epitaxial layer (hereinafter referred to as "epilayer") dislocations, cracks, wafer warp/bow, and/or wafer breakage, particularly for thick films required by III-nitride semiconductor devices, e.g. high electron mobility transistors (HEMTs).

Therefore, there is a need of producing a III-nitride semiconductor devices having a dislocation density less than or equal to $1 \times 10^9$ cm$^{-2}$ on a substrate optionally greater than or equal to 6 inches (150 mm) in diameter.

SUMMARY

The following presents a simplified summary of the basic features of the present invention in order to provide a basic understanding of some aspects of the present invention.

The technology of growing GaN on a silicon carbide (SiC) or sapphire substrate is well-established. However, the SiC or sapphire substrate is expensive and difficult to process, so that a semiconductor device based on such substrate is difficult to realize mass production or manufacturing cost reduction. Based on the above disadvantages, GaN-on-Si is a recent development trend. Si substrates have the cost advantages, and GaN-on-Si is advantageous to being compatible with a modern Si semiconductor manufacturing process.

There are several fundamental issues for GaN-on-Si epitaxial structures arising from the material mismatch between GaN(0001) and Si(111). For example, the difference in TECs between GaN and Si is as high as 34%, so that the epilayer cracking or substrate bow is generally caused during the growth of epilayers or at the room temperature. The same also holds for the nitride epilayers of the other Group-III elements (e.g. Al or In) on a heterogeneous substrate.

To remedy the mismatches between a substrate and a III-nitride epitaxial layer, the present invention thus provides a semiconductor device with a reduced number of defects. The device comprises: a substrate; a stack of III-nitride transition layers disposed on the substrate, the stack of III-nitride transition layers maintaining an epitaxial relationship to the substrate; a first III-nitride layer disposed on the stack of III-nitride transition layers; and a second III-nitride layer disposed on the first III-nitride layer, the second III-nitride layer having a band gap energy greater than that of the first III-nitride layer, wherein the stack of III-nitride transition layers comprises a first transition layer, a second transition layer on the first transition layer, and a third transition layer on the second transition layer, and wherein the second transition layer has a minimum aluminium molar ratio among the first transition layer, the second transition layer and third transition layer.

The present invention further provides a semiconductor device, comprising: a substrate; a stack of III-nitride transition layers disposed on the substrate, the stack of III-nitride transition layers maintaining an epitaxial relationship to the substrate; a first III-nitride layer disposed on the stack of III-nitride transition layers; and a second III-nitride layer disposed on the first III-nitride layer, the second III-nitride layer having a band gap energy greater than that of the first III-nitride layer, wherein the stack of III-nitride transition layers comprises a first transition layer, a second transition layer on the first transition layer, and a third transition layer on the second transition layer, and wherein the second transition layer has a maximum in-plane lattice constant among the first transition layer, the second transition layer and the third transition layer.

The present invention further relates to a method of forming the semiconductor devices described in this specification. The method comprises: providing a substrate; forming a first transition layer on the substrate at a first temperature; forming a second transition layer on the first transition layer at a second temperature greater than the first temperature; forming a third transition layer on the second transition layer at a third temperature greater than the first temperature; forming a first III-nitride layer on the third transition layer; and forming a second III-nitride layer having a band gap energy greater than that of the first III-nitride layer on the first III-nitride layer.

The inventors have unexpectedly found that the present invention effectively reduces the dislocation density to $1 \times 10^9$ cm$^{-2}$ or less. In addition, the present invention effectively reduces the bow of the wafer to <30 μm, such that the die yields of a single wafer reaches up to 75% or more.

BRIEF DESCRIPTION OF THE DRAWINGS

The present invention is described in detail with reference to the following figures.

DETAILED DESCRIPTION

Figure 1A:
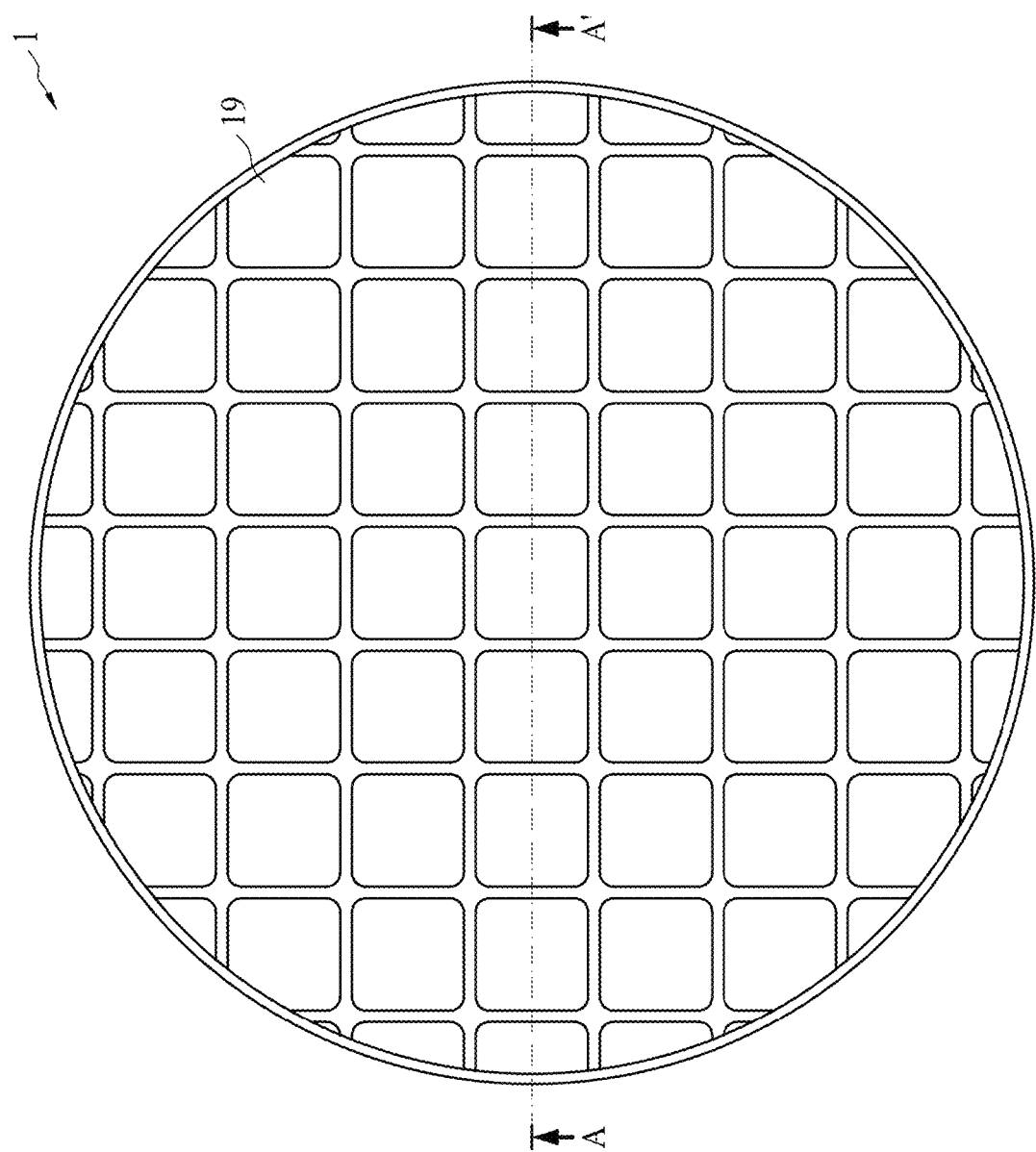
FIG. 1(a) shows a wafer with a plurality of III-nitride semiconductor dies (units or chips) disposed thereon.
Figure 1B:
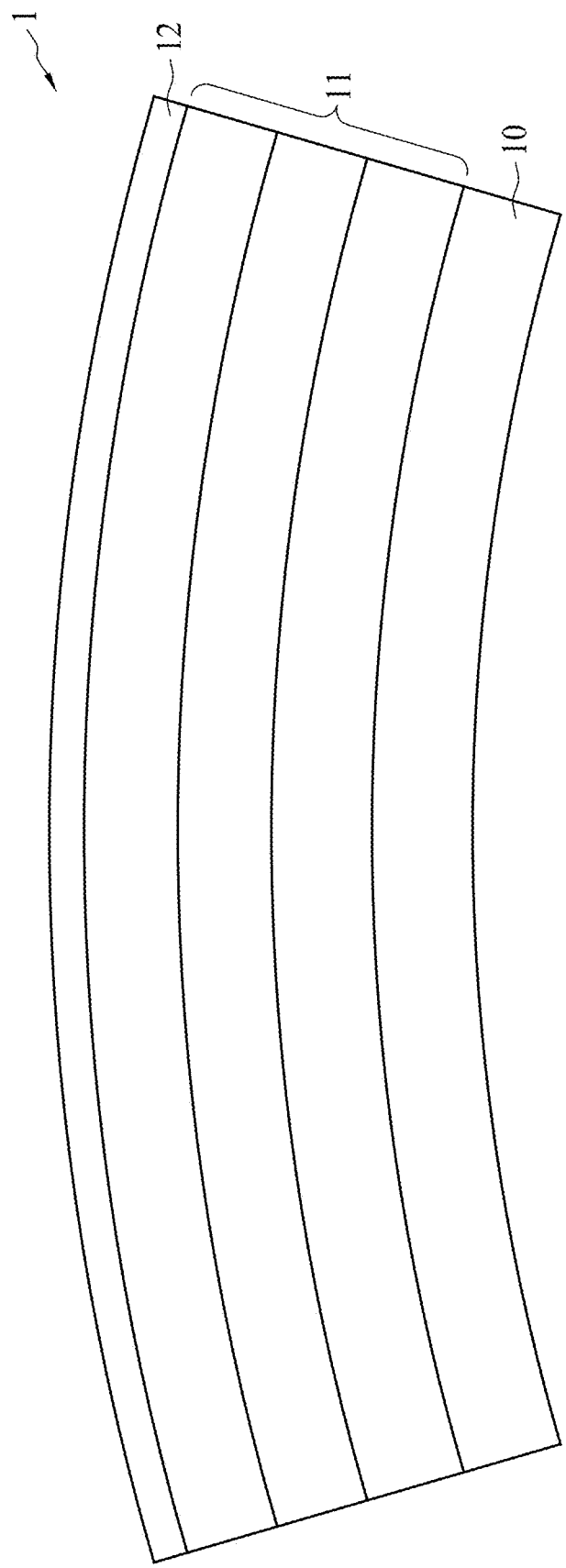
FIG. 1(b) shows a cross-sectional view of the wafer drawn on a tangent plane along the connecting line A-A' in FIG. 1(a) at an elevated temperature for manufacturing the plurality of semiconductor dies.

To make the figures clear and concise, unless otherwise specified, the same reference numerals in different figures indicate the same components. In addition, to simplify the description, descriptions and details of well-known steps and components may be omitted. Although devices may be described herein as some n-channel or p-channel devices or some n-type or p-type doping devices, it is found through effortful research that, the present invention may also be applied to complementary devices. The word "approximately," "substantially" or "basically" used herein means that a value of a component has a parameter that is expected to be close to a stated value or position. However, as is well known in the art, there are always small differences that prevent a value or position from being exactly the stated value or position. It is acknowledged in the art that a deviation of up to at least ten percent (10%) (and even to twenty percent (20%) for some components including semiconductor doping concentrations) is a reasonable deviation from an ideal target exactly as described. The terms "first", "second", "third", and the like (as used in part of a component name) in the claims and/or specific embodiments are used to distinguish similar components, and do not necessarily describe an order in time, space, rank, or any other way. It should be understood that, such terms may be interchanged under appropriate circumstances, and the embodiments described herein may be operated in other orders than that described or exemplified herein. The phrase "some embodiments" means that specific features, structures, or characteristics described in combination with the embodiments are included in at least one embodiment of the present invention. Therefore, the phrase "in some embodiments" appearing at different positions throughout this specification does not necessarily refer to the same embodiment, but in some cases, may refer to the same embodiment. In addition, it is apparent to a person of ordinary skill in the art that, in one or more embodiments, specific features, structures, or characteristics may be combined in any appropriate manner.

In this specification, the term "lattice constant" is understood to be the lattice constant of the material when its crystal lattice is relaxed. If the material forms a strained heteroepitaxial layer as in case of the second layer deposited on the first layer, its actual in-plane lattice constant deviates from the lattice constant of the material in a relaxed state. The term "in-plane lattice constant" refers to the lattice spacing along the direction substantially parallel to the interface between the first layer and the second layer. The term "epitaxy" refers to any method enabling oriented growth of a single crystalline material on another single crystalline material. The so-called "normal direction" refers to a normal direction of an interface between a first nitride semiconductor layer and a second nitride semiconductor layer of an HEMT device; in some cases, the "normal direction" may alternatively be a normal direction of a flowing direction of two-dimensional electron gas of an HEMT device; and in some cases, the "normal direction" may alternatively be a stacking direction of epitaxial layers. The so-called "tangential direction" refers to a tangential direction of an interface between a first nitride semiconductor layer and a second nitride semiconductor layer of an HEMT device; in some cases, the "tangential direction" may alternatively be a tangential direction of a flowing direction of two-dimensional electron gas of an HEMT device; and in some cases, the "tangential direction" alternatively refers to a direction along a connecting line between a source contact and a drain contact of an HEMT device.

The following disclosure provides various embodiments or examples for implementing different features of the present invention. Specific examples of components and arrangements are described below. Certainly, the descriptions are merely examples and are not intended to be limiting. In this application, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in this application, reference numerals and/or letters may be repeated in examples. This repetition is for the purpose of simplification and clarity, and does not indicate a relationship between the described various embodiments and/or configurations.

The embodiments of the present invention are described in detail below. However, it should be understood that many applicable concepts provided by the present invention may be implemented in a plurality of specific environments. The described specific embodiments are only illustrative and do not limit the scope of the present invention.

In theory, single crystalline GaN is the ideal substrate for the epitaxial growth of III-nitrides, in particular GaN. However, since bulk GaN, e.g. more than 2 inches (50 mm) in size, is not currently available under industrially viable conditions and has an excessively high cost, sapphire and SiC are other potential substrates for growing III-nitrides. In addition to the cost concern of growing III-nitrides on sapphire or SiC, the major defect of growing III-nitride layers on sapphire or SiC is the presence of the "micropipes" in the epilayers. The micropipes are the defects caused by the formation of screw dislocation during material growth and typically have a diameter of the order of 250 to 500 nm. The density of the micropipes of the order of $3 \times 10^5$ to $6 \times 10^5$ cm' has thus been identified.

In the aspect of optimizing the cost of the semiconductor devices, the substrate supporting the III-nitrides should be available in a large size (typically greater than or equal to 6 inches (150 mm)) and have a reasonable cost. In this connection, Si is one of the preferred substrates due to its low cost, availability, and suitability for standardized semiconductor processing methods. However, except for the aforementioned advantages, the Si substrate, has two main drawbacks: (1) a significant lattice mismatch with respect to III-nitrides; and (2) a significant mismatch in TECs between Si and III-nitrides. Specifically, for the a Si(111) substrate with a lattice parameter of 3.840 Å, the lattice mismatch between GaN (0001), of which the lattice parameter is 3.189

Å, and Si(111) is 16.9%. The TEC of GaN is $5.6\times10^{-6}$ $K^{-1}$; whereas that of Si is $2.6\times10^{-6}$ $K^{-1}$. This represents a TEC mismatch of 53.7%.

FIG. 1 shows the formation of dislocations or cracks in the epilayers and the formation of the substrate warp/bow due to the TEC mismatch between III-nitride layers epitaxially grown on a heterogeneous substrate. FIG. 1(a) shows a wafer 1 with a plurality of III-nitride semiconductor dies (units or chips) 19 disposed thereon. FIG. 1(b) shows a cross-sectional view of the wafer drawn on a tangent plane along the connecting line A-A' in FIG. 1 (a) at an elevated temperature for manufacturing the plurality of semiconductor dies. The wafer 1 is comprises, from bottom to top, a substrate 10, a stack of III-nitride epilayers 11 on the substrate 10, and a III-nitride heterojunction 12 on the stack of III-nitride transition layers 11. Since the III-nitride epilayers are grown at elevated temperatures, and as stated above the TEC of a III-nitride epilayer is about two times that of the substrate 10, the III-nitride epilayers would elongate more than diameter of the Si wafer so that the wafer 1 would be convexly bended at an elevated temperature for growing the III-nitride epilayers as shown in FIG. 1(b). When the wafer 1 cools down from an elevated temperature to room temperature, since the contraction rate of the substrate 10 is lower that and that of the stack of III-nitride transition layers 11, on returning to room temperature after epitaxy, the difference in TECs results in a semiconductor device having a considerable concave bow as shown in FIG. 1(c). If a GaN-on-Si structure is taken as an example, the Si wafer may apply tensile stress of approximately +1.4 GPa to a GaN epilayer at room temperature. Moreover, the amount of bow increases with increasing thickness of the III-nitride epilayers. Typically, the amount of bow may reach to at least 60 μm. Any further processing would not be possible due to such high amount of bow. For example, the bow of a wafer would result in a non-uniform temperature distribution on the growth surface of a wafer and leads to poor epi quality. The bow of a wafer causes defocus problems in a photolithography process and is disadvantageous to a wafer transfer system operated on the basis of vacuum absorption. Since the process yield is greatly affected by the bow of a wafer, the degree of bow should be kept as low as possible.

Figure 1C:
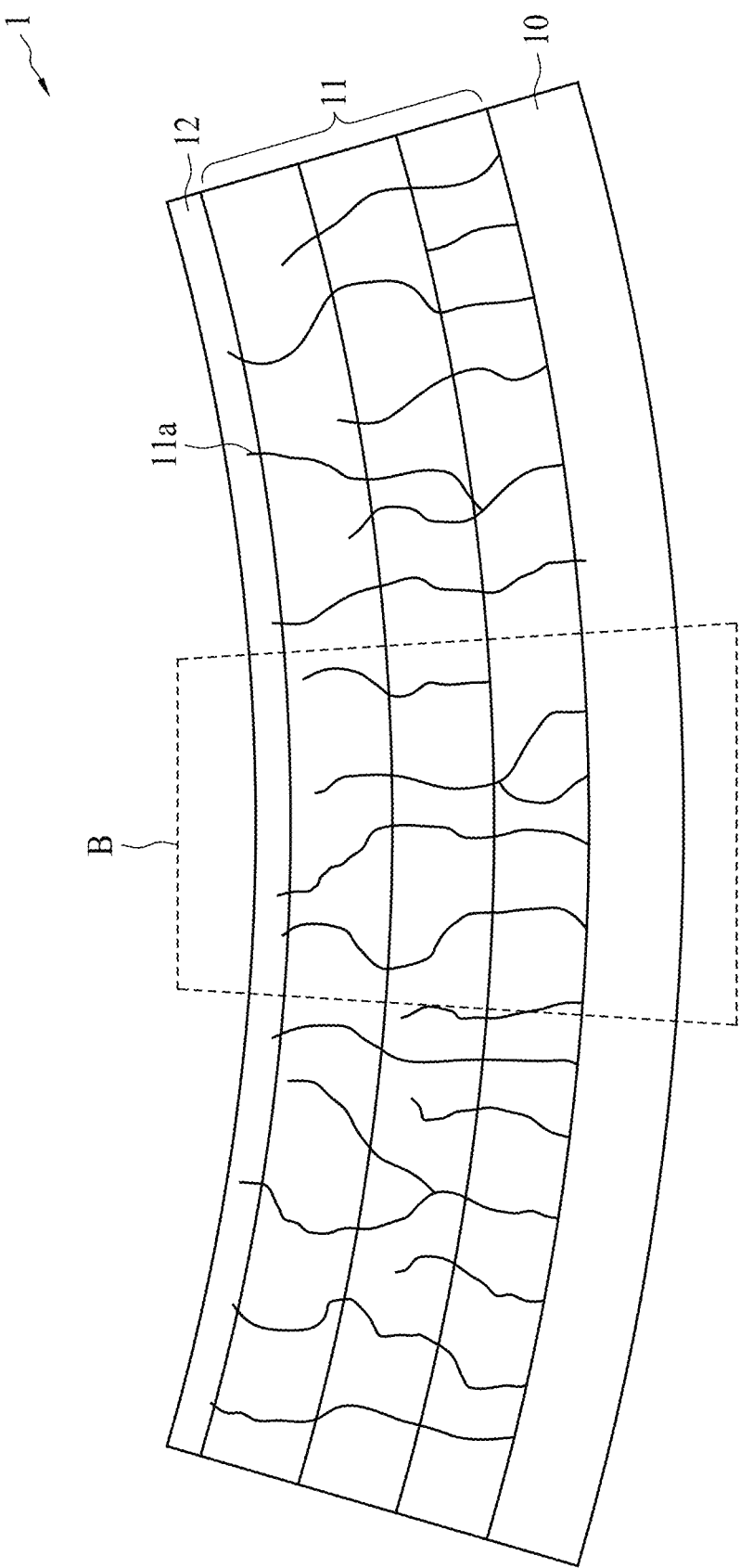
FIG. 1(c) shows a cross-sectional view of the wafer drawn on a tangent plane along a connecting line A-A' in FIG. 1(a) after cooling from an elevated temperate to room temperature.
Figure 1D:
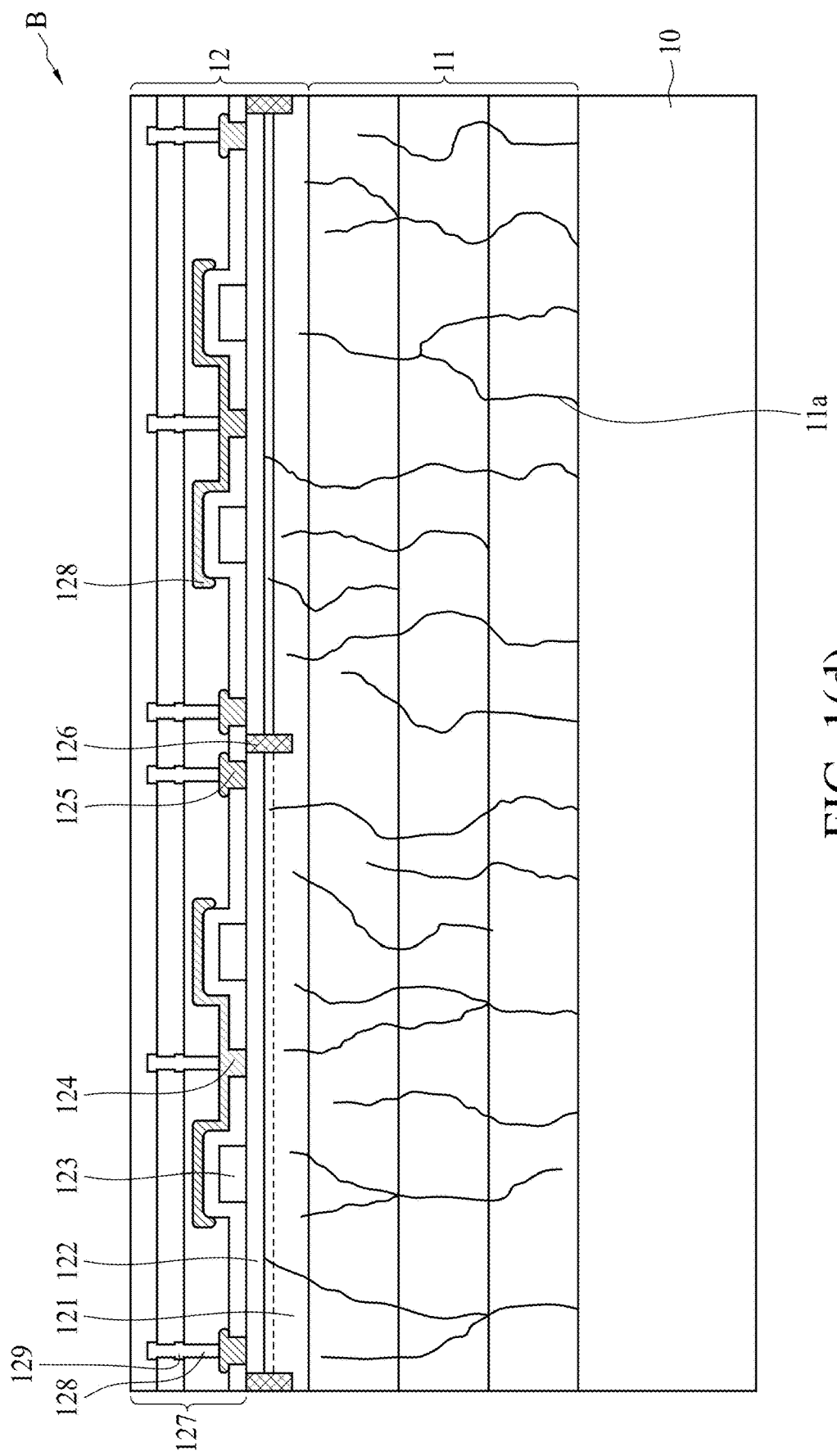
FIG. 1(d) shows an enlarge view of the dotted region B in FIG. 1(c).

To relax such huge stress, a great quantity of dislocations or cracks 11a is generally formed in the stack of III-nitride transition layers 11 as shown in FIG. 1(c). In other words, TEC mismatch is the source of dislocations or cracks formed in the stack of III-nitride transition layers 11 to release the stress. FIG. 1(d) shows an enlarge view of the dotted region B in FIG. 1(c) and reveals the details of the III-nitride heterojunction 12. The III-nitride heterojunction 12 typically comprise a III-nitride layer 121 as a channel layer on the stack of III-nitride transition layers 11, a III-nitride layer 122 as a barrier layer on the III-nitride layer 121, a gate electrode 123 on the III-nitride layer 122, and a source contact 124 and drain contact 125 separated by the gate electrode 123 on the III-nitride layer 122. The semiconductor devices can be isolated by the isolations 126. The gate electrode 123, source contact 124, and drain contact 125 may be covered and/or surrounded by one or more dielectric layers 127. In some cases, one or more field plates 128 can be arranged on the channel region between the gate electrode 123 and drain contact 125 to modulate the distribution of the electrical field. The gate electrode 123, source contact 124, drain contact may be connected to the vias 129 and metal layers 130 to provide electrical connections. Due to the lattice discontinuity caused by the dislocations or cracks 11a penetrated to the III-nitride heterojunction 12, such defects are potentially harmful for device performances (leakage currents, ageing, etc.). Specifically, since the dislocations or cracks 11a may serve as energy traps of carries, the concentration of 2DEG in the regions around the dislocations or cracks may be much lower than that of the other regions so that the current density of a HEMT may be decreased.

Figure 2A:
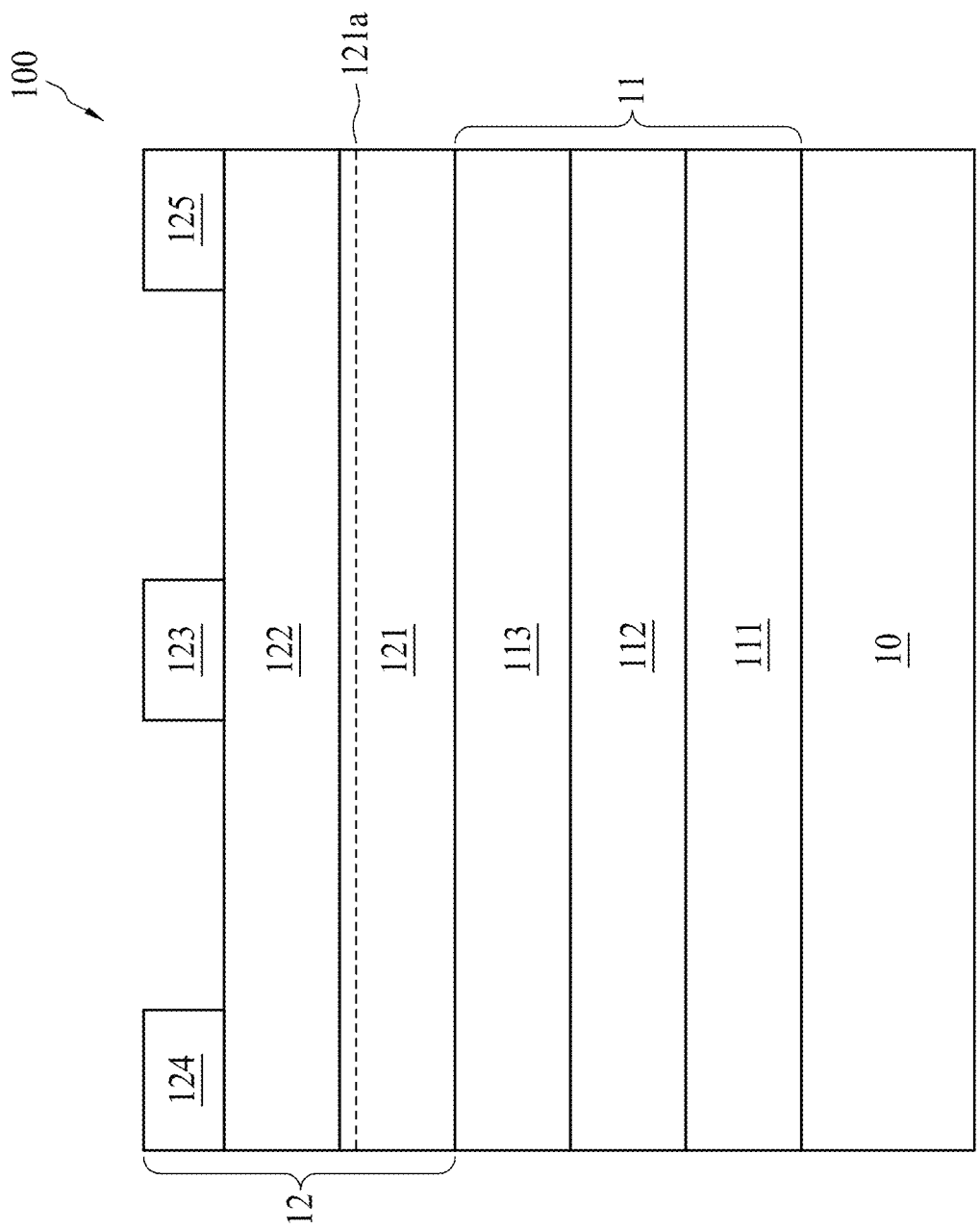
FIG. 2(a) shows a semiconductor device 100 according to an embodiment of the present invention.

According to the present invention, this concave bow (created by the mismatch of the TECs) can be compensated by the stack of III-nitride transition layers 11 through an optimized design of the geometry and composition of each of the layers in the stack of III-nitride transition layers 11. The novel semiconductor device according to an embodiment of the present invention is provided in FIG. 2(a). The semiconductor device 100 is constructed on a substrate 10. A stack of III-nitride transition layers 11 is disposed on the substrate 10. A III-nitride layer 121 is arranged on the stack of III-nitride transition layers 11. Since the stack of III-nitride transition layers 11 functions to modulate the strain/stress state of the layer disposed thereon, the III-nitride layer 121 preferably is a stress or stain relaxed epilayer. For HEMT applications, a III-nitride layer 122 may be optionally arranged on the III-nitride layer 122 so that The III-nitride layer 121 and the III-nitride layer 122 are configured to form two-dimensional electron gas (2DEG) 121a in the III-nitride layer 121 along an interface between the III-nitride layer 121 and the III-nitride layer 122. In this connection, the III-nitride layer 121 may be considered as a channel layer, whereas the III-nitride layer 122 may be considered as a barrier layer. A gate electrode 123, a source contact 124, and a drain contact 125 may be arranged on the III-nitride layer 122. The gate electrode 123 is positioned between the source contact 124 and the drain contact 15 substantially along the tangential direction.

Figure 2B:
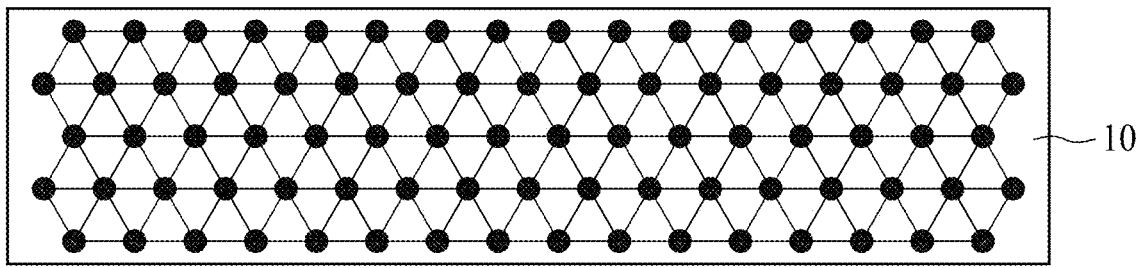
FIG. 2(b) to FIG. 2(f) show an operation for implementing the semiconductor device 100 illustrated in FIG. 2(a).

FIG. 2(b) shows the substrate 10 suitable for the present invention. The substrate 10 and the III-nitride layer 121 should be of heterogeneous materials. For example, if GaN is selected as the material of the III-nitride layer 121, the substrate 10 should be the materials other than GaN. The substrate 10 may include, but is not limited to, silicon (Si), doped silicon (doped Si), porous silicon, zinc oxide, silicon carbide (4H—SiC or 6H—SiC), silicon-germanium (SiGe) alloy, gallium arsenide (GaAs), sapphire, silicon on an insulator (SOI), SOP SiC (Silicon-on-poly SiC), 3C—SiC/Si(111), or other suitable materials. The substrate 10 is advantageously a single crystalline substrate, which is available in large sizes (typically greater than 6 inches (150 mm), for example, 8, 10, or 12 inches), inexpensive and suitable for the epitaxial growth of III-nitrides. In this respect, Si is a particularly preferred material.

The Si substrate suitable for the present invention can be obtained by using the Czochralski (CZ) method, highly doped with boron (conveyed by a resistivity of less than 5 mΩ·cm), having a thickness of 650 to 1300 μm, provided with or devoid of a flat area. The Si substrate may have a very high boron doping, such that its resistivity is less than 2 mΩ·cm. The Si substrate may be doped with nitrogen, the N concentration being of the order of $5\times10^{14}$ $cm^{-3}$. With such a very high boron doping and/or nitrogen co-doping, the Si substrate presents a greater yield strength, thereby providing to the grown the subsequent the stack of III-nitride transition layers 11 a greater compressive strain, which in turn better compensates for the tensile strain during cooling. The Si substrate may have a TEC of $2.6\times10^{-6}$ $K^{-1}$.

As shown in FIG. 2(b), the Si substrate preferably has a diamond structure, and thus has two atoms in a primitive cell. The crystal lattice of silicon can be represented as two penetrating face-centered cubic lattices with the cube side a=5.43 Å. The Si substrate is preferably is a Si (111) substrate, such that the growth surface of the Si substrate is (111) facet. On the (111) facet, the lattice parameter of Si may be 3.840 Å.

It is noteworthy that the present invention is also applicable to any substrate having the same features as Si in respect of the target applications. The substrate 10 may be a bulk substrate or formed of an assembly of layers; it may have undergone a structuring method (masking, slicing, etc.), or any chemical and/or physical treatment (surface treatment, implantation, doping, etc.).

The stack of III-nitride transition layers 11 helps to modulate the stress or strain that arises due to lattice and TEC mismatches between the substrate 10 and the overlying III-nitride layer 121. In the absence of the stack of III-nitride transition layers 11, the stress is typically accommodated by the generation of misfit dislocations or macroscopic cracks in the epilayers as stated above. Thus, by providing an alternative mechanism for accommodating stress, the presence of the stack of III-nitride transition layers 11 may reduce the generation of dislocations or cracks. Surprisingly, the stack of III-nitride transition layers 11 can further promote the generation of favorable stress or strain conditions which can prevent the overlying III-nitride layer 121 from forming the discloses, cracks or other defects and can reduce warp or bow of the overall semiconductor device 100.

To modulate the stress or strain state of the overlying III-nitride layer 121, the stack of III-nitride transition layers 11 is disposed on the substrate 10. The stack of III-nitride transition layers 11 takes over the crystal structure of the substrate 10. The stack of III-nitride transition layers 11 maintains an epitaxial relationship to the substrate 10. The stack of III-nitride transition layers 11 may be used to promote lattice match between the substrate 10 and the overlying III-nitride layer 121. It is noteworthy that the stack of III-nitride transition layers 11 is structurally and functionally different from a conventional super lattice and should be arranged under a conventional super lattice.

Figure 2C:
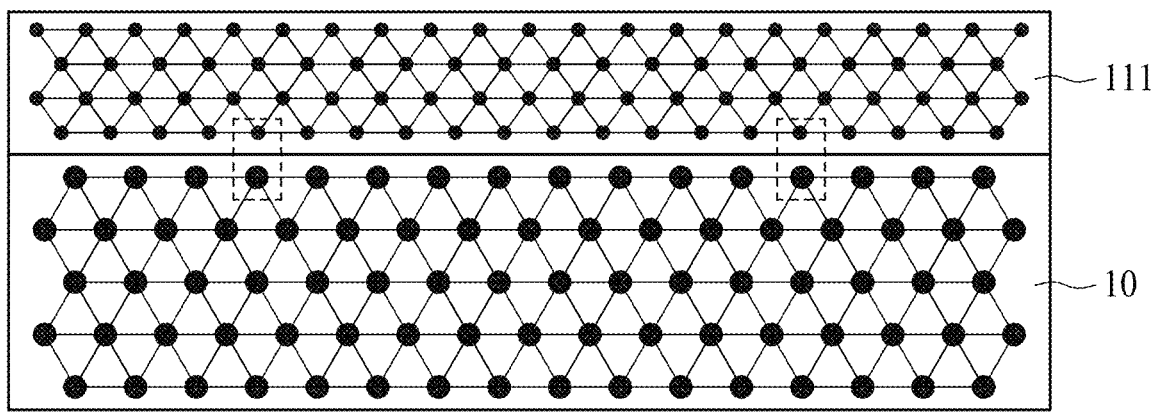

The stack of III-nitride transition layers 11 comprises a transition layer 111, a transition layer 112 on the transition layer 111, and a transition layer 113 on the transition layer 112. The transition layer 111 functions to compress the overlying epilayer. As shown in FIG. 2(c), the transition layer 111 is disposed on the substrate 10. The transition layer 111 is in direct contact with the substrate 10. The transition layer 111 may take over the crystal structure of the substrate 10. The transition layer 111 and the substrate 10 should be of heterogeneous materials. Preferably, the transition layer 111 comprises $Al_wGa_{1-w}N$, where $0.9 \leq w \leq 1$. For example, w may be, but not limited to, 0.900, 0.905, 0.910, 0.915, 0.920, 0.925, 0.930, 0.935, 0.940, 0.945, 0.950, 0.955, 0.96, 0.965, 0.970, 0.975, 0.980, 0.985, 0.990, 0.995, or 1.000.

The transition layer 111 is single crystalline. The transition layer 111 has basic hexagonal symmetry and may be a wurtzite structure. It is noteworthy that the atomic arrangement along the <1-100> axis in a wurtzite structure is similar to the atomic arrangement along the <111> direction in a diamond structure. In this connection, the transition layer 111 maintains an epitaxial relationship to the substrate 10 even if the transition layer 111 and the substrate 10 are of heterogeneous materials with different crystal structure.

To reduce the lattice mismatch between the substrate 10 and the transition layer 111, a coincidence site lattice structure as indicated in the dotted box regions in FIG. 2(c) can be formed at the interface between the substrate 10 and the transition layer 111. The coincidence range of the transition layer 111 to the substrate 10 can be 10:1 to 1:10, in which the proportion number of the transition layer 111 can be an integer from 1 to 10; whereas the proportion number of the substrate 10 can be an integer from 1 to 10. Such a commensurate relationship makes the effective lattice mismatch between the transition layer 111 and the substrate 10 greatly reduced to less than or equal to 5%, e.g. 4.5, 4, 3.5, 3, 2.5, 2, 1.5, 1 or 0.5%, compared to the bulk lattice constant mismatch.

The transition layer 111 preferably has an in-plane lattice constant ranging from approximately 3.112 Å to approximately 3.120 Å. For example, the in-plane lattice constant of the transition layer 111 may be, but not limited to, 3.112, 3.113, 3.114, 3.115, 3.116, 3.117, 3.118, 3.119, or 3.120 Å. Since an epitaxial relationship is established between the transition layer 111 and substrate 10, on returning from an elevated temperature to room temperature after epitaxy, the substrate 10 gives rise to very high tensile strain to the transition layer 111 due to the significant difference in TECs between the transition layer 111 and the substrate 10.

The transition layer 111 has a thickness less than that of the transition layer 112. The transition layer 111 has a thickness equal to that of the transition layer 112. The transition layer 111 has a thickness greater than that of the transition layer 112. The transition layer 111 has a thickness less than that of the transition layer 113. The transition layer 111 has a thickness equal to that of the transition layer 113. The transition layer 111 has a thickness greater than that of the transition layer 113. The transition layer 111 has a thickness ranging from approximately 50 nm to approximately 300 nm. For example, the thickness of the transition layer 111 may be, but not limited to, 50, 60, 80, 100, 120, 140, 150, 160, 180, 200, 220, 240, 250, 260, 280 or 300 nm.

Figure 2D:
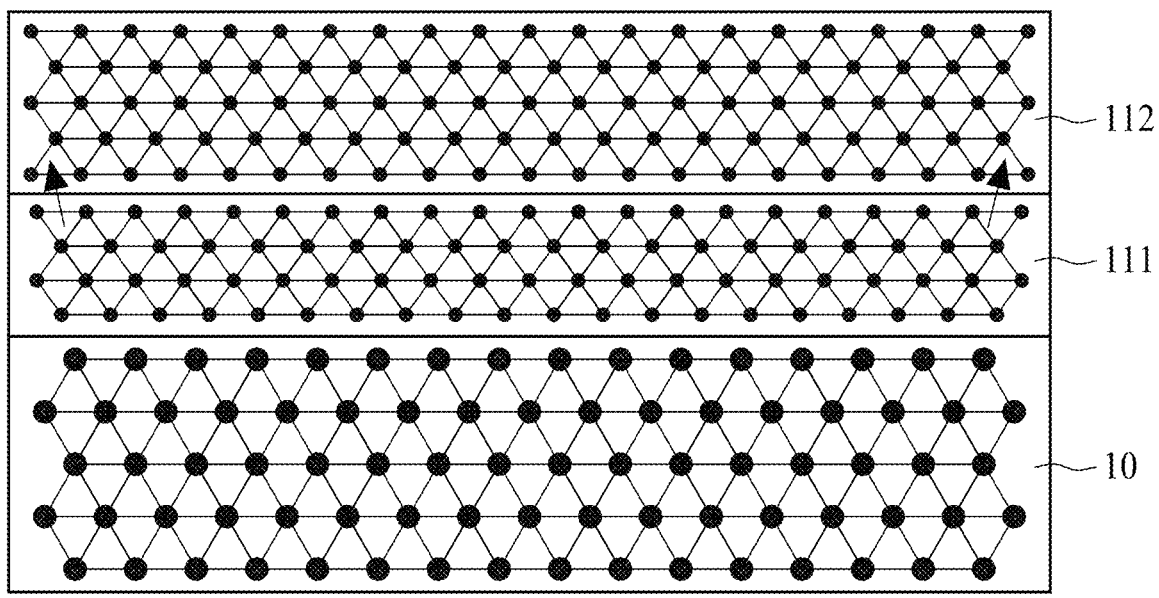

As shown in FIG. 2(d), the transition layer 112 is disposed on the transition layer 111. The transition layer 112 is in direct contact with the transition layer 111. The transition layer 112 takes over the crystal structure of the transition layer 111. The transition layer 112 and the transition layer 111 should be of heterogeneous materials. The transition layer 112 functions to expand the underlying epilayer (see the arrows in FIG. 2(d)). The transition layer 112 functions to expand the overlying epilayer. Preferably, the transition layer 112 comprises $Al_xGa_{1-x}N$, where $0.4 \leq x \leq 0.8$. For example, x may be, but not limited to, 0.40, 0.42, 0.44, 0.45, 0.46, 0.48, 0.50, 0.52, 0.54, 0.55, 0.56, 0.58, 0.60, 0.62, 0.64, 0.65, 0.66, 0.68, 0.70, 0.72, 0.74, 0.75, 0.76, 0.78 or 0.80.

The transition layer 112 has a thickness less than that of the transition layer 111. The transition layer 112 has a thickness equal to that of the transition layer 111. The transition layer 112 has a thickness greater than that of the transition layer 111. The transition layer 112 has a thickness less than that of the transition layer 113. The transition layer 112 has a thickness equal to that of the transition layer 113. The transition layer 112 has a thickness greater than that of the transition layer 113. The transition layer 112 has a thickness ranging from approximately 50 nm to approximately 300 nm. For example, the thickness of the transition layer 112 may be, but not limited to, 50, 60, 80, 100, 120, 140, 150, 160, 180, 200, 220, 240, 250, 260, 280 or 300 nm.

The transition layer 112 is single crystalline. The transition layer 112 has basic hexagonal symmetry and may be a wurtzite structure. In this connection, the transition layer 112 maintains an epitaxial relationship to the transition layer 111.

The transition layer 112 has an in-plane lattice constant greater than that of the transition layer 111. The transition layer 112 has an in-plane lattice constant greater than that of the transition layer 113. The transition layer 112 preferably has an in-plane lattice constant ranging from approximately 3.127 Å to approximately 3.158 Å. For example, the in-plane lattice constant of the transition layer 112 may be, but not limited to, 3.127, 3.128, 3.130, 3.132, 3.134, 3.135, 3.136, 3.138, 3.140, 3.142, 3.144, 3.145, 3.146, 3.148, 3.150, 3.152, 3.154, 3.155, 3.156 or 3.158 Å.

Since the in-plane lattice constant of the transition layer 112 is greater than that of the transition layer 111, the translation layer 112 is subject to compressive stress when grown epitaxially on the transition layer 111. Without wishing to be bound to the theory, it is believed that if the transition layer 112 is grown on the transition layer 111, the compressive stress exerted on the transition layer 112 can be up to several GPa, and thus compensate for the thermally induced tensile stress generated on returning from an elevated temperature to room temperature by the difference in TECs between the III-nitride epilayers and the substrate 10. At room temperature, while the transition layer 111 is subject to high tensile strain, the transition layer 112 is practically at equilibrium, the compressive stress maintained in the transition layer 112 having compensated for the thermally induced tensile strain generated during cooling.

Figure 2E:
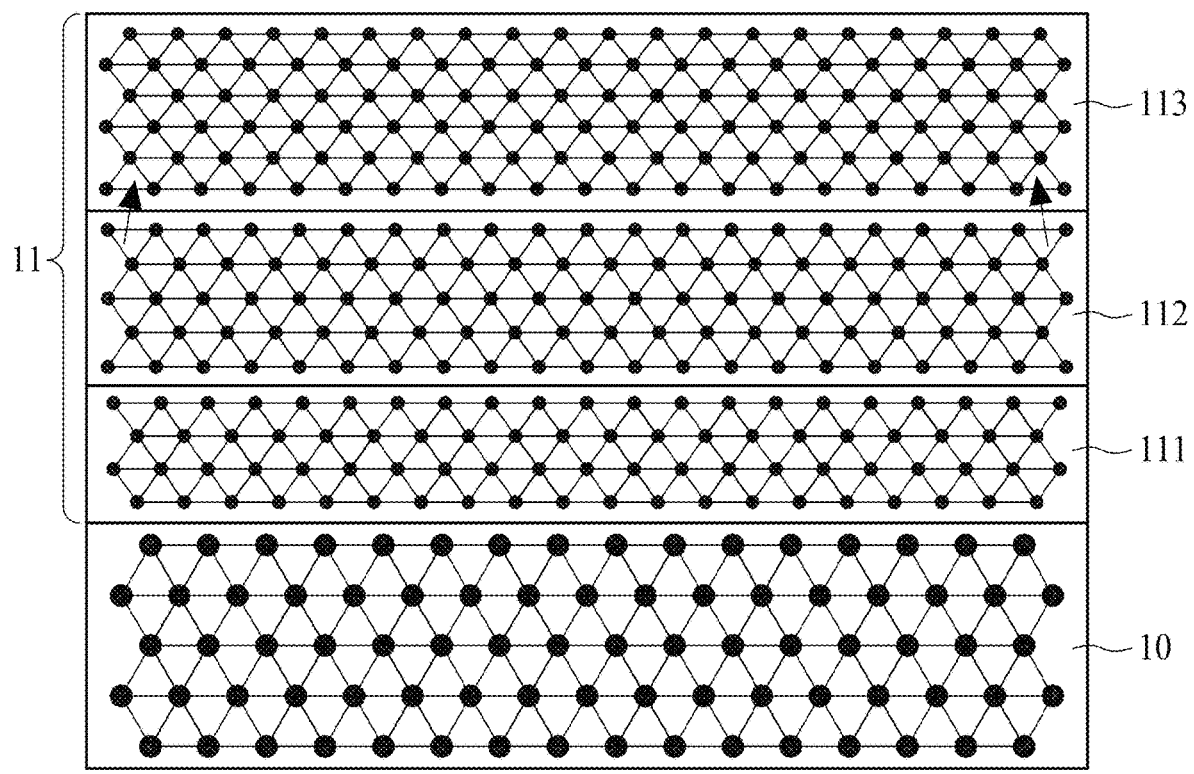

As shown in FIG. 2(e), the transition layer 113 is disposed on the transition layer 112. The transition layer 113 is in direct contact with the transition layer 112. The transition layer 113 takes over the crystal structure of the transition layer 112. The transition layer 113 and the transition layer 112 should be of heterogeneous materials. The transition layer 113 functions to compress the underlying epilayer (see the arrows in FIG. 2(e)). The transition layer 113 functions to compress the overlying epilayer. Preferably, the transition layer 113 comprises $Al_yGa_{1-y}N$, where $0.4 \leq y \leq 0.8$. For example, y may be, but not limited to, 0.40, 0.42, 0.44, 0.45, 0.46, 0.48, 0.50, 0.52, 0.54, 0.55, 0.56, 0.58, 0.60, 0.62, 0.64, 0.65, 0.66, 0.68, 0.70, 0.72, 0.74, 0.75, 0.76, 0.78 or 0.80.

The transition layer 113 has a thickness less than that of the transition layer 111. The transition layer 113 has a thickness equal to that of the transition layer 111. The transition layer 113 has a thickness greater than that of the transition layer 111. The transition layer 113 has a thickness less than that of the transition layer 112. The transition layer 113 has a thickness equal to that of the transition layer 112. The transition layer 113 has a thickness greater than that of the transition layer 112. The transition layer 113 has a thickness ranging from approximately 50 nm to approximately 300 nm. For example, the thickness of the transition layer 113 may be, but not limited to, 50, 60, 80, 100, 120, 140, 150, 160, 180, 200, 220, 240, 250, 260, 280 or 300 nm.

The transition layer 113 is single crystalline. The transition layer 113 has basic hexagonal symmetry and may be a wurtzite structure. In this connection, the transition layer 113 maintains an epitaxial relationship to the transition layer 112.

The transition layer 113 has an in-plane lattice constant less than that of the transition layer 111. The transition layer 113 has an in-plane lattice constant equal to that of the transition layer 111. The transition layer 113 has an in-plane lattice constant greater than that of the transition layer 111. The transition layer 112 has an in-plane lattice constant less than that of the transition layer 112. The transition layer 113 preferably has an in-plane lattice constant ranging from approximately 3.127 Å to approximately 3.158 Å. For example, the in-plane lattice constant of the transition layer 113 may be, but not limited to, 3.127, 3.128, 3.130, 3.132, 3.134, 3.135, 3.136, 3.138, 3.140, 3.142, 3.144, 3.145, 3.146, 3.148, 3.150, 3.152, 3.154, 3.155, 3.156 or 3.158 Å.

Since the in-plane lattice constant of the transition layer 112 is greater than that of the transition layer 113, the translation layer 112 is subject to compressive stress when the transition layer 113 is epitaxially grown on the transition layer 112. Without wishing to be bound to the theory, it is believed that if the transition layer 113 is grown on the transition layer 112, the compressive stress exerted on the transition layer 112 can be up to several GPa, and thus compensate for the thermally induced tensile stress generated on returning elevated temperature to room temperature by the difference in TECs between the III-nitride epilayers and the substrate 10. At room temperature, the transition layer 113 helps to maintain the compressive stress resulted in the transition layer 112. The compressive stress functions to compensate for the thermally induced tensile strain generated during cooling.

When the stack of III-nitride transition layers 11 according to the present invention is applied to a heterogeneous substrate 10, one of the following design rules may be followed:

1. The transition layer 111 comprises $Al_wGa_{1-w}N$, where $0.9 \leq w \leq 1$ and has a thickness $t_{111}$ ranging from approximately 50 nm to approximately 300 nm.
2. The transition layer 111 has an in-plane lattice constant $a_{111}$ ranging from approximately 3.112 Å to approximately 3.120 Å and a thickness $t_{111}$ ranging from approximately 50 nm to approximately 300 nm.
3. The transition layer 112 comprises $Al_xGa_{1-x}N$, where $0.4 \leq x \leq 0.8$ and has a thickness $t_{112}$ ranging from approximately 50 nm to approximately 300 nm.
4. The transition layer 112 has an in-plane lattice constant $a_{112}$ ranging from approximately 3.127 Å to approximately 3.158 Å and a thickness $t_{112}$ ranging from approximately 50 nm to approximately 300 nm.
5. The transition layer 113 comprises $Al_yGa_{1-y}N$, where $0.4 \leq y \leq 0.8$ and has a thickness $t_{113}$ ranging from approximately 50 nm to approximately 300 nm.
6. The transition layer 113 has an in-plane lattice constant $a_{113}$ ranging from approximately 3.127 Å to approximately 3.158 Å and a thickness $t_{113}$ ranging from approximately 50 nm to approximately 300 nm.
7. The transition layer 111 comprises $Al_wGa_{1-w}N$, where $0.9 \leq w \leq 1$. The transition layer 112 comprises $Al_xGa_{1-x}N$, where $0.4 \leq x \leq 0.8$. The transition layer 111 has a thickness till ranging from approximately 50 nm to approximately 300 nm. The transition layer 112 has a thickness $t_{112}$ ranging from approximately 50 nm to approximately 300 nm. In this case, $w > x$, $t_{111} < t_{112}$, $0.25 \leq w-x \leq 0.5$, and $t_{112} - t_{111} \geq 40$ nm.
8. The transition layer 111 has an in-plane lattice constant $a_{111}$ ranging from approximately 3.112 Å to approximately 3.120 Å. The transition layer 112 has an in-plane lattice constant $a_{112}$ ranging from approximately 3.127 Å to approximately 3.158 Å. The transition layer 111 has a thickness $t_{111}$ ranging from approximately 50 nm to approximately 300 nm. The transition layer 112 has a thickness $t_{112}$ ranging from approximately 50 nm to approximately 300 nm. In this case, $a_{111} < a_{112}$ and $t_{111} < t_{112}$. The transition layer 112 may apply tensile stress to the transition layer 111 at room temperature. In this case, $0.0185 \leq a_{112} - a_{111} \leq 0.037$, and $t_{112} - t_{111} \geq 40$ nm
9. The transition layer 111 comprises $Al_wGa_{1-w}N$, where $0.9 \leq w \leq 1$. The transition layer 113 comprises $Al_yGa_{1-y}N$, where $0.4 \leq y \leq 0.8$. The transition layer 111 has a thickness $t_{111}$ ranging from approximately 50 nm to approximately 300 nm. The transition layer 113 has a thickness $t_{113}$ ranging from approximately 50 nm to approximately 300 nm. In this case, w>y, $t_{111}<t_{113}$, 0.25≤w−y≤0.5, and $t_{113}−t_{111}$≥100 nm.

10. The transition layer 111 has an in-plane lattice constant $a_{111}$ ranging from approximately 3.112 Å to approximately 3.120 Å. The transition layer 113 has an in-plane lattice constant $a_{113}$ ranging from approximately 3.127 Å to approximately 3.158 Å. The transition layer 111 has a thickness $t_{111}$ ranging from approximately 50 nm to approximately 300 nm. The transition layer 113 has a thickness $t_{113}$ ranging from approximately 50 nm to approximately 300 nm. In this case, $a_{111}<a_{113}$, $t_{111}<t_{113}$, 0.0185≤$a_{113}−a_{111}$≤0.037 and $t_{113}−t_{111}$≥100 nm 11. The transition layer 112 comprises $Al_xGa_{1-x}N$, where 0.4≤x≤0.8. The transition layer 113 comprises $Al_yGa_{1-y}N$, where 0.4≤y≤0.8. The transition layer 112 has a thickness $t_{112}$ ranging from approximately 50 nm to approximately 300 nm. The transition layer 113 has a thickness $t_{113}$ ranging from approximately 50 nm to approximately 300 nm. In this case, x<y, $t_{112}<t_{113}$, 0≤x−y≤0.5, and $t_{113}−t_{112}$≥100 nm.

12. The transition layer 112 has an in-plane lattice constant $a_{112}$ ranging from approximately 3.127 Å to approximately 3.158 Å. The transition layer 113 has an in-plane lattice constant $a_{113}$ ranging from approximately 3.127 Å to approximately 3.158 Å. The transition layer 112 has a thickness $t_{112}$ ranging from approximately 50 nm to approximately 300 nm. The transition layer 113 has a thickness $t_{113}$ ranging from approximately 50 nm to approximately 300 nm. In this case, $a_{112}>a_{113}$ and $t_{112}<t_{113}$. The transition layer 113 may apply compressive stress to the transition layer 112 at room temperature. In this case, 0≤$a_{113}−a_{112}$≤0.037 and $t_{113}−t_{112}$≥100 nm.

13. The transition layers 111, 112 and 113 may be designed according to the proviso given in Table 1:

TABLE 1

| | Composition | | Thickness | |
|---|---|---|---|---|
| Alloy | | Relationship | Range (nm) | Relationship |
| Transition layer 111 | $Al_wGa_{1-w}N$, where 0.9 ≤ w ≤ 1 | w > x; and x < y | $t_{111}$ = 50-300 | $t_{111} < t_{112} < t_{113}$ |
| Transition layer 112 | $Al_xGa_{1-x}N$, where 0.4 ≤ x ≤ 0.8 | | $t_{112}$ = 50-300 | |
| Transition layer 113 | $Al_yGa_{1-y}N$, where 0.4 ≤ y ≤ 0.8 | | $t_{113}$ = 50-300 | |

14. The transition layers 111, 112 and 113 may be designed according to the proviso given in Table 2:

TABLE 2

| | In-plane lattice constant | | Thickness | |
|---|---|---|---|---|
| | Range (Å) | Relationship | Range (nm) | Relationship |
| Transition layer 111 | $a_{111}$ = 3.112-3.120 | $a_{111} < a_{112}$; and $a_{112} > a_{113}$ | $t_{111}$ = 50-300 | $t_{111} < t_{112} < t_{113}$ |
| Transition layer 112 | $a_{112}$ = 3.127-3.158 | | $t_{112}$ = 50-300 | |
| Transition layer 113 | $a_{113}$ = 3.127-3.158 | | $t_{113}$ = 50-300 | |

The transition layer 112 may apply tensile stress to the transition layer 111 at room temperature. The transition layer 113 may apply compressive stress to the transition layer 112 at room temperature.

Accordingly, the present invention overcomes the lattice mismatch and thermal mismatch between the substrate 10 and the III-nitride layer 121 by using the stack of III-nitride transition layers 11. The present invention thus allows the growth of a high quality III-nitride heterojunction 12 on a heterogeneous substrate 10 by using a specially designed strain release structure, i.e., the stack of III-nitride transition layers 11.

Figure 2F:
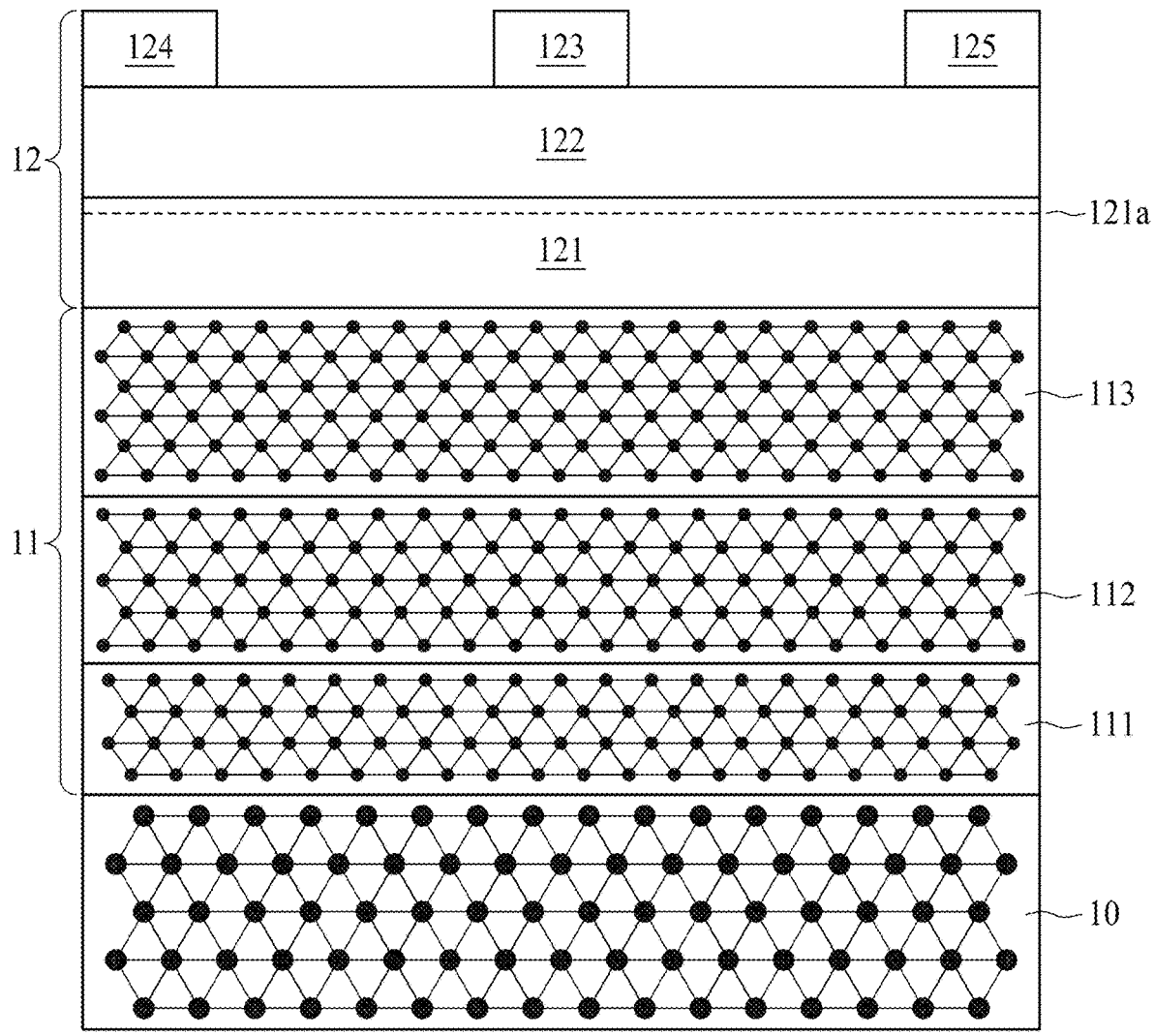

As shown in FIG. 2(f), the III-nitride layer 121 of the III-nitride heterojunction 12 is then disposed on the stack of III-nitride transition layers 11. The III-nitride layer 121 may serve as the channel layer of the semiconductor device 100. Since the III-nitride layer 121 is grown in a relaxed manner, the III-nitride layer 121 has a reduced number of dislocations and cracks, preferably is free of dislocations and cracks. The III-nitride layer 121 may comprise, but being not limited to, $In_\alpha Al_\beta Ga_{1-\alpha-\beta}N$, where α+β≤1, for example, α=0, 0.1, 0.2, 0.3, 0.4, 0.5, 0.6, 0.7, 0.8, 0.9 or 1.0; β=0, 0.1, 0.2, 0.3, 0.4, 0.5, 0.6, 0.7, 0.8, 0.9 or 1.0. The III-nitride layer 121 may comprise, but being not limited to, $Al_\beta Ga_{1-\beta}N$, where β≤1, for example, β=0, 0.1, 0.2, 0.3, 0.4, 0.5, 0.6, 0.7, 0.8, 0.9 or 1.0.

The thickness of the III-nitride layer 121 may be, but not limited to 0.3 μm or more, for example 0.3, 0.4, 0.5, 0.6, 0.7, 0.8, 0.9, 1, 1.2, 1.4, 1.5, 1.6, 1.8, 2, 2.2, 2.4, 2.5, 2.6, 2.8 or 3, preferably 0.5 μm or more. Surprisingly, the III-nitride layer 121 having a thickness of 0.3 μm or more, preferably 0.5 μm or more that is free of cracks can thus be obtained according to the present invention.

The III-nitride layer 122 of the III-nitride heterojunction 12 is then disposed on the III-nitride layer 121. The III-nitride layer 122 may serve as the barrier layer of the semiconductor device 100. The III-nitride layer 122 may comprise, but being not limited to, $In_\alpha Al_\beta Ga_{1-\alpha-\beta}N$, where α+β≤1, for example, α=0, 0.1, 0.2, 0.3, 0.4, 0.5, 0.6, 0.7, 0.8, 0.9 or 1.0; β=0, 0.1, 0.2, 0.3, 0.4, 0.5, 0.6, 0.7, 0.8, 0.9 or 1.0. The III-nitride layer 122 may comprise, but being not limited to, $Al_\beta Ga_{1-\beta}N$, where for example, β=0, 0.1, 0.2, 0.3, 0.4, 0.5, 0.6, 0.7, 0.8, 0.9 or 1.0. The III-nitride layer 122 has a band gap energy greater than that of the III-nitride layer 121. For example, the III-nitride layer 121 may include a GaN layer, which has a bandgap of about 3.4 eV. The III-nitride layer 122 may include $Al_{0.25}Ga_{0.75}N$, which has a bandgap of about 4 eV. A heterojunction may be formed between the III-nitride layer 121 and the III-nitride layer 122. The 2DEG region 121a, as shown by dotted lines, is formed in the III-nitride layer 121 through polarization of the heterojunction of different nitrides and is generally formed in a layer with a smaller bandgap (for example GaN) to serve as an electron channel region. In the 2DEG region 121a, the electron gas may freely move in a two-dimensional direction, and is limited in a three-dimensional direction (for example, substantially in the normal direction of the two-dimensional electron gas). The III-nitride layer 121 can provide or remove electrons in the 2DEG region, and conduction of the semiconductor device 100 can be further controlled.

If the III-nitride layer 122 has a higher bandgap, the carrier concentration in the 2DEG region 121a is thus increased. A higher carrier concentration of the channel for high-current operation is a very important parameter for high-power devices. If AlGaN is used as a material of the III-nitride layer 122, the Aluminium molar ratio may be 20 to 40%. If the Al content is too high, crystalline blocks can be easily formed in the III-nitride layer 122, and a problem of stress release of the epitaxial layer may be appeared.

The stack of III-nitride transition layers 11 according to the present invention is suitable for either a gate-first process or a gate-last process. Said gate-first process refers to the case that a gate electrode 123 is formed before a source contact 124 and a drain contact 125 are formed. Said gate-last process refers to the case that a source contact 124 and a drain contact 125 are formed before a gate electrode 123 is formed.

The gate electrode 123 may be formed on the III-nitride layer 122, for example, formed on the surface of the III-nitride layer 122 so as to provide electric connection of the semiconductor device 100. The gate electrode 123 may include a conductive material, for example, but be not limited to, titanium (Ti), tantalum (Ta), tungsten (W), aluminum (Al), cobalt (Co), copper (Cu), nickel (Ni), platinum (Pt), plumbum (Pb), molybdenum (Mo). The gate electrode 123 may include the compounds of the aforementioned material, for example, but be not limited to, titanium nitride (TiN), tantalum nitride (TaN), other conductive nitrides, or conductive oxides), metal alloy (such as Al—Cu alloy), or other suitable materials. The gate electrode 123 may be formed by a single metal or a metal stack (such as tungsten and/or titanium or other well-known electrode materials). The gate electrode 123 should be configured to form a Schottky junction with the III-nitride layer 122 to further reduce the gate leakage current.

Having generated a practical channel, i.e. the 2DEG region 121a, under the gate electrode 123, the III-nitride layer 121 is preset to be in an ON state when the gate electrode 123 is in a zero-bias state. Such a device may also be known as a depletion mode device.

An enhancement mode device is contrary to the depletion mode device. The III-nitride layer 121 of an enhancement mode device is preset to be in an OFF state when the gate electrode 123 is in the zero-bias state. To form the enhancement mode device, a doped III-nitride layer (not shown in the figures) is necessarily disposed between the gate electrode 123 and the III-nitride layer 122 so as to deplete or remove part of the two-dimensional electron gas 121a. It should also be understood by skilled persons that, the two-dimensional electron gas 121a, including its depleted region, in the III-nitride layer 121 forms a channel region of the III-nitride layer 121, and flowing of electrons through the channel region is controlled through a gate voltage applied onto the gate electrode 123 during operation.

The doped III-nitride layer and the III-nitride layer 122 may form a pn junction used to deplete the two-dimensional electron gas 121a. Since the pn junction depletes the two-dimensional electron gas 121a, when the gate electrode 123 is in the zero-bias state, no current can passes through the III-nitride layer 121, i.e., a threshold voltage of the semiconductor device 100 is a positive value. The doped III-nitride layer is favorable for reducing the leakage current, and increasing the threshold voltage.

The gate electrode 123 may be in direct contact with the doped III-nitride layer. The gate electrode 123 may also be electrically connected to the doped III-nitride layer. Substantially in the normal direction, the doped III-nitride layer may be disposed under the gate electrode 123, and the gate electrode 123 may be positioned above the doped III-nitride layer. The gate electrode should be configured to form a Schottky junction with the doped III-nitride layer to further reduce the gate leakage current.

In low-voltage application (for example, semiconductor devices applicable to 10 V to 200 V), the gate electrode 123 may have a width greater than about 0.4 µm substantially in the tangential direction. The width of the gate electrode 123 may be about 0.4 µm to about 1.2 µm. If the doped III-nitride layer is present, the width of the gate electrode 123 is smaller than the width of the doped III-nitride layer substantially in the tangential direction.

In high-voltage application (for example, semiconductor devices applicable to 200 V or higher), the gate electrode 123 may have a width greater than about 1.6 µm substantially in the tangential direction.

The semiconductor device 100 may also include a source contact 124 and a drain contact 125, and the source contact 124 and the drain contact 125 may be formed into a metal region disposed on the portion of the III-nitride layer 122. The material of the source contact 124 and that of the drain contact 125 form an ohmic contact with the III-nitride layer 122, respectively so as to collect or provide electrons to the 2DEG region 121a. The source contact 124 and the drain contact 125 may include, for example, but are not limited to, a conductor material. The conductor material may include, for example, but is not limited to, a metal, an alloy, a doped semiconductor material (for example, doped crystalline silicon), or other suitable conductor materials. Metal for forming the source contact 124 or the drain contact 125 may include refractory metals or compounds thereof, for example, but not limited to, metals such as aluminum (Al), titanium (Ti), niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), osmium (Os) and iridium (Ir) or compounds of the metals, such as tantalum nitride (TaN), titanium nitride (TiN), and tungsten carbide (WC). The source contact 124 and the drain contact 125 may be formed by a single metal or a metal stack (such as tungsten and/or titanium or other well-known electrode materials).

Part of the source contact 124 may be positioned in the III-nitride layer 122. Part of the drain contact 125 may be positioned in the III-nitride layer 122. Part of the source contact 124 may be in direct contact with the 2DEG region 121a. Part of the drain contact 125 may be in direct contact with the 2DEG region 121a. The source contact 124 may be disposed on the III-nitride layer 122. The drain contact 125 may be disposed on the III-nitride layer 122.

The semiconductor device 100 of the present invention may further include one or more field plates 128 (see FIG. 1(d)) on the III-nitride layer 122 to modulate the electric field nearest to the drain contact 125 and at a corner position of the gate electrode 123, thereby improving the stability of the semiconductor device 100 and increasing the breakdown voltage between the gate electrode 123 and the drain contact 125. The semiconductor device 100 may include one, two, three, four or more field plates 128. The field plate 128 may be disposed above the doped III-nitride layer (if present) or the gate electrode 123. The field plate 128 may have a common potential with the source contact 124 or have a common potential with the gate electrode 123. The field plate 128 may be directly connected to the source contact 124. The field plate 128 may be electrically connected to the source contact 124. The field plate 128 may enable the electric field among the conductor structures (for example, the gate electrode 123, source contact 124, and drain contact 125) to be averagely distributed, and improve the voltage tolerance so as to smoothly release the voltage, thereby further improving the reliability of the device. The field plate 128 may reduce the electric field of the gate electrode 123, and increase the threshold voltage.

Typically, the length range of the field plate 128 in the low-voltage device may be 0.4 to 1.2 μm. An oversized field plate 128 may increase the capacitance effect between the gate electrode 123 and the drain contact 125, thereby causing negative Miller feedback, and reducing the cut-off frequency of the current gain and the power gain. Additionally, if the field plate 128 approaches to the drain contact 125, the electric field intensity of the field plate 128 at the end point of the side near the drain contact 125 may be improved, and the breakdown voltage is further reduced.

Figure 3:
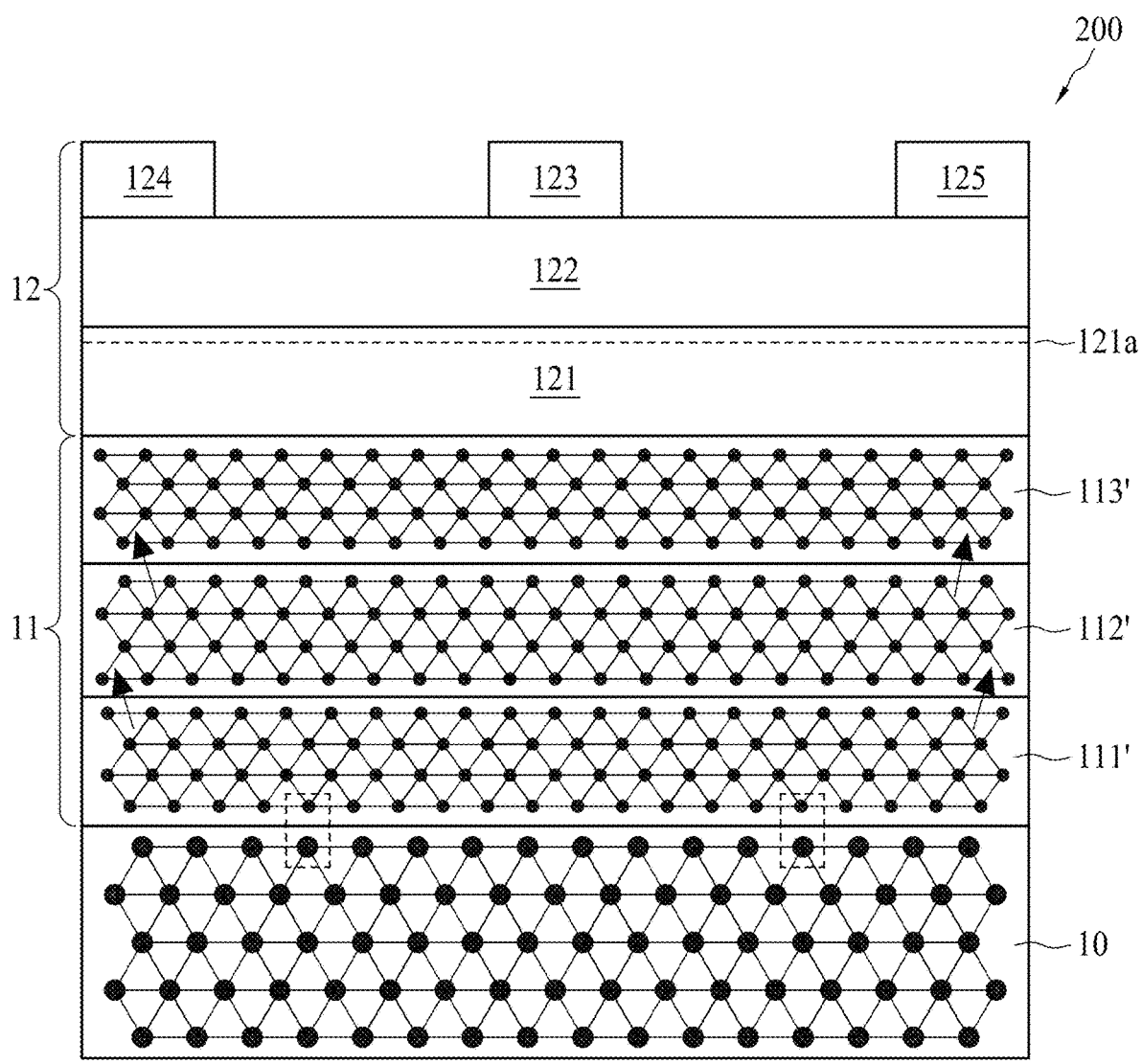
FIG. 3 shows a semiconductor device 200 according to another embodiment of the present invention.

FIG. 3 shows a semiconductor device 200 similar to the semiconductor 100 described above. The differences reside in that the aluminium molar ratios of the transition layers 111'-113' progressively and discretely decreases along the normal direction from the transition layer 111' to the transition layers 113', such that the in-plane lattice constants of the transition layers $a_{111'}$-$a_{113'}$ are monotonously increased. Surprisingly, it is found that the absolute value of the stress/strain in the III-nitride layer 121 of the semiconductor device 100 is far less that of the semiconductor device 200. The degree of substrate bow of the semiconductor device 100 is far less than that of the semiconductor device 200.

Figure 4:
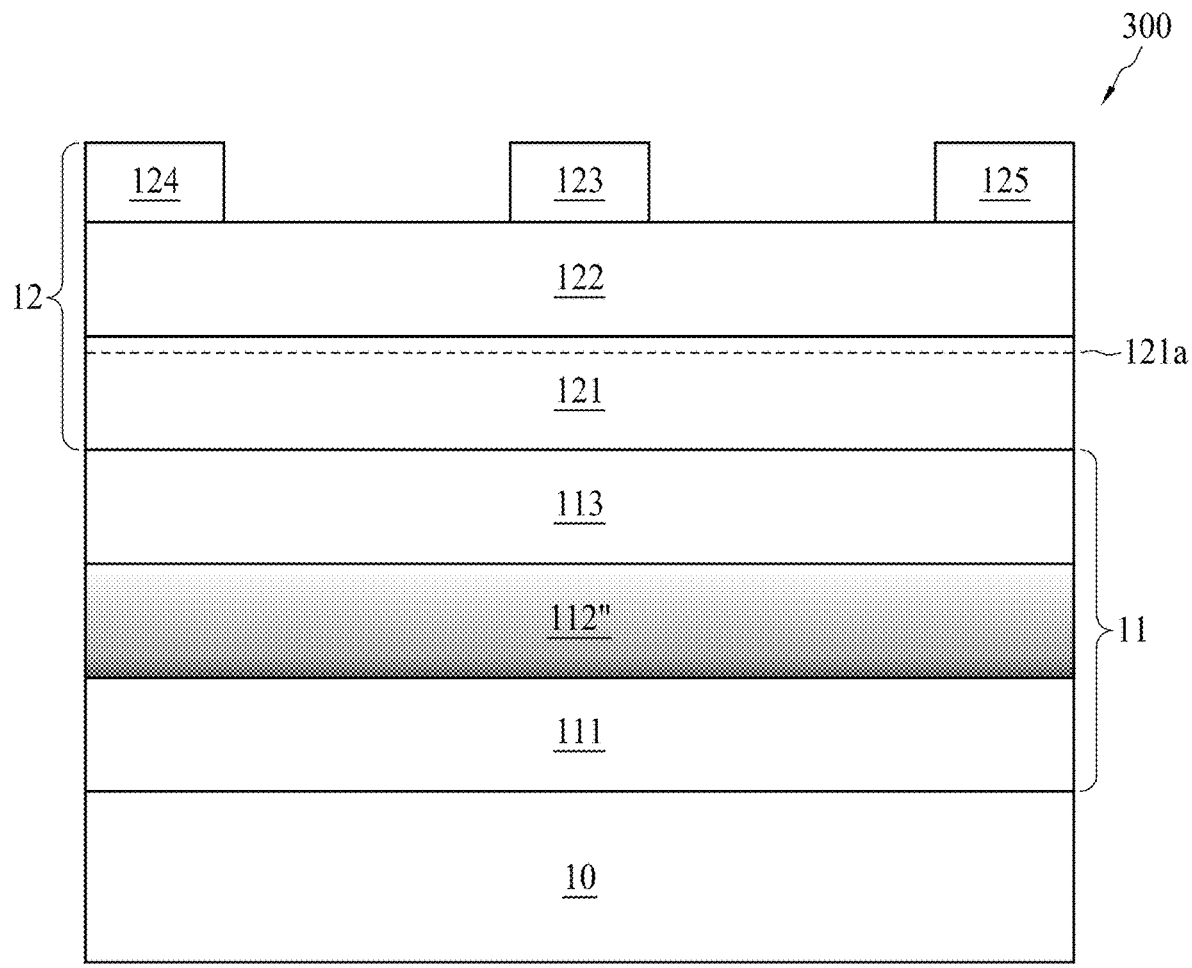
FIG. 4 shows a semiconductor device 300 according to another embodiment of the present invention.

FIG. 4 shows a semiconductor device 300 similar to the semiconductor 100 according to the present invention. The difference resides in that the transition layer 112 of the semiconductor device 100 is replaced by a gradient transition layer 112", of which the aluminium molar ratio progressively and gradually decreases from the interface between the transition layer 111 and the gradient transition layer 112" to the interface between gradient transition layer 112" and the transition layer 113. Surprisingly, it is found that the absolute value of the stress/strain in the III-nitride layer 121 of the semiconductor device 100 is far less that of the semiconductor device 300. The degree of substrate bow of the semiconductor device 100 is far less than that of the semiconductor device 300.

Figure 5:
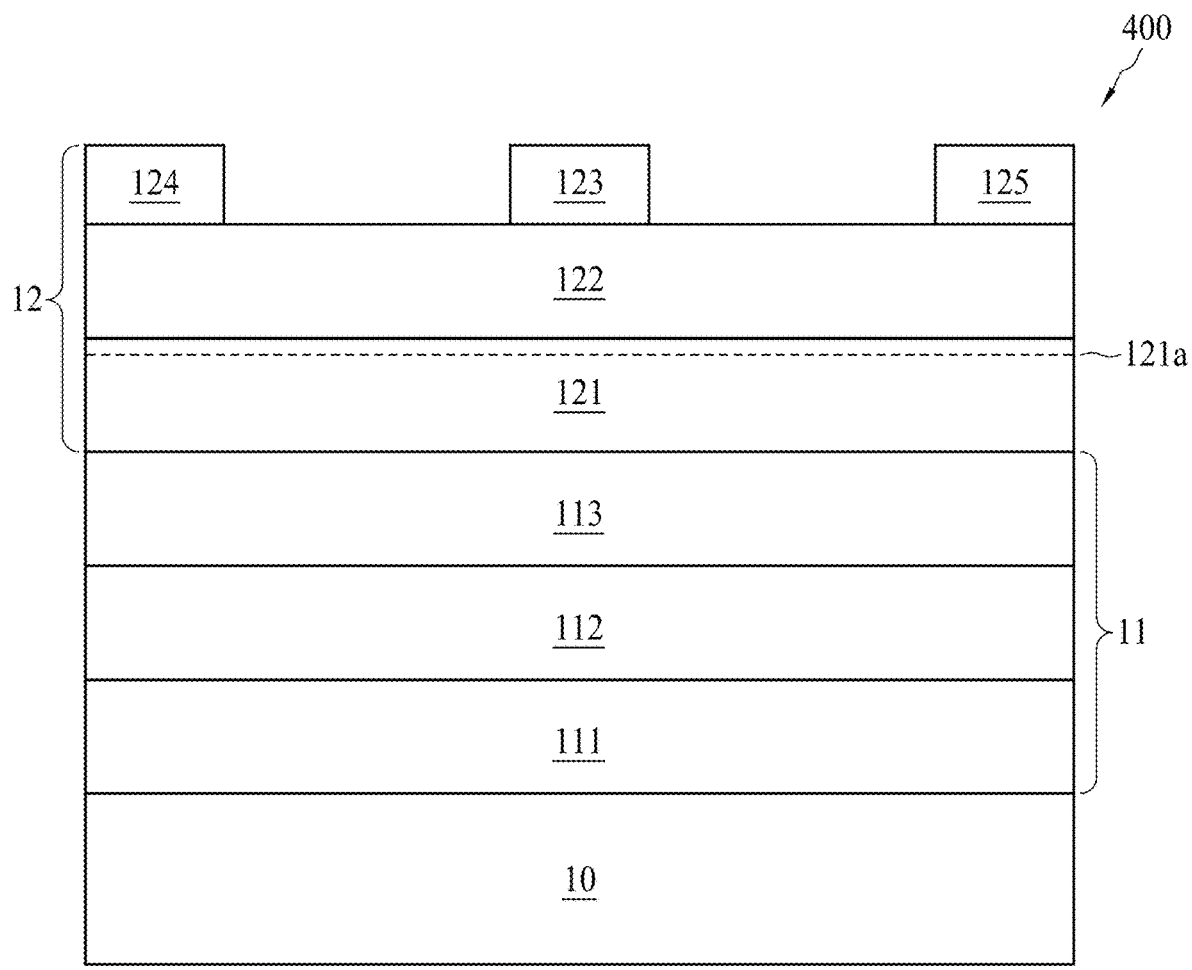
FIG. 5 shows a semiconductor device 400 according to another embodiment of the present invention.

FIG. 5 shows a semiconductor device 400 according to an embodiment of the present invention, in which the transition layer 111 comprises AlN, the transition layer 112 comprises GaN, and the transition layer 113 comprises AlN. Surprisingly, it is found that the absolute value of the stress/strain in the III-nitride layer 121 of the semiconductor device 100 is far less that of the semiconductor device 400. The degree of substrate bow of the semiconductor device 100 is far less than that of the semiconductor device 400.

Surprisingly, by adjusting the compositions, in-plane lattice constants, and the thicknesses of the transition layers 111-113, a certain amount of stress is generated in the epilayers on a convex bowing wafer at an elevated temperature. The amount of stress that is generated in the epilayers is enough to counterbalance the thermally induced stress generated on returning from an elevated temperature to room temperature by the difference in TECs between the III-nitride epilayers and the substrate 10. Structures obtained by means of the present invention preferably have a dislocation density less than or equal to $1\times10^9$ cm$^{-2}$, particularly when the thickness of the III-nitride layer 121 exceeds 1 μm in thickness.

Figure 6A:
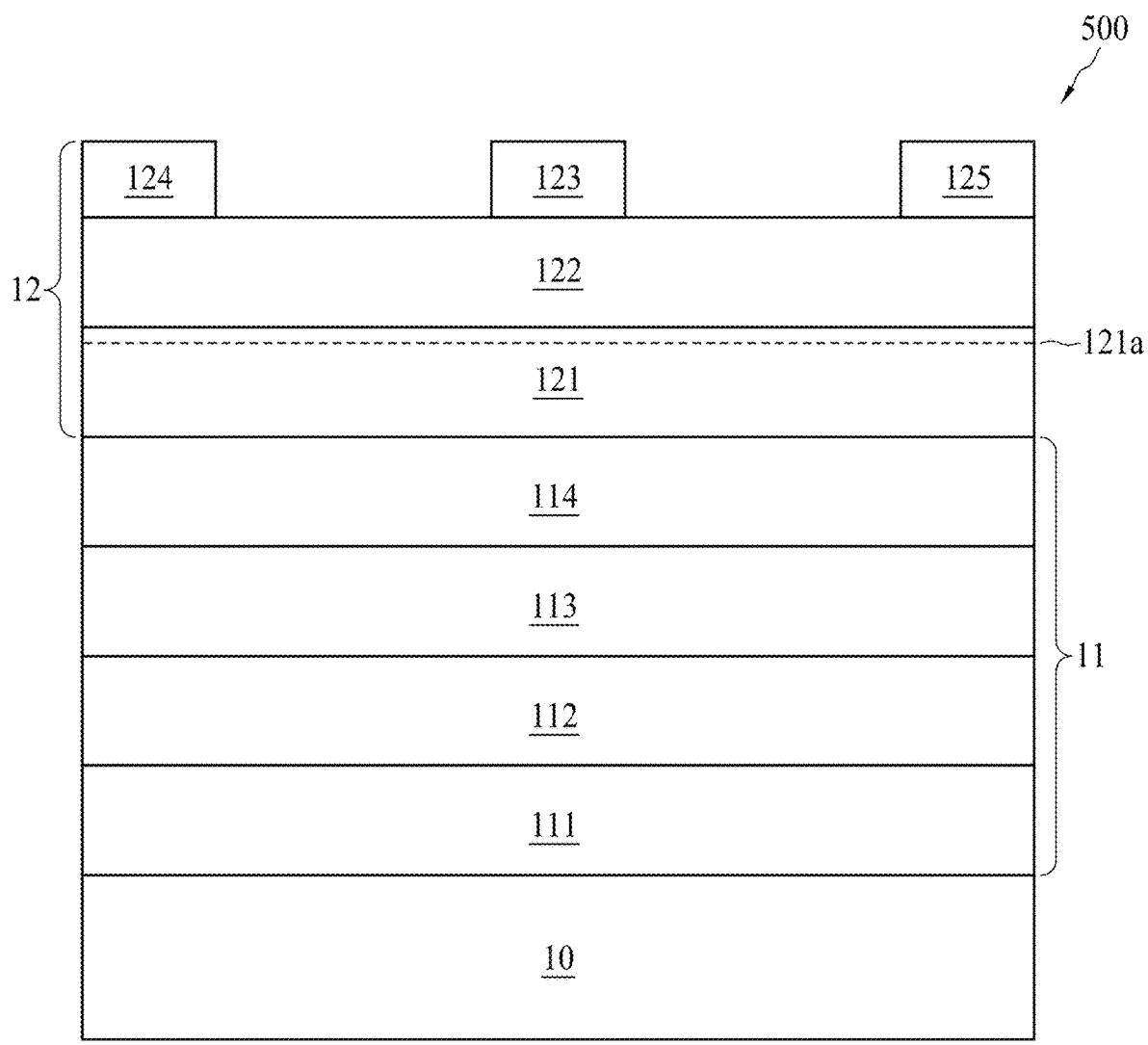
FIG. 6(a) shows a semiconductor device 500 according to another embodiment of the present invention.
Figure 6B:
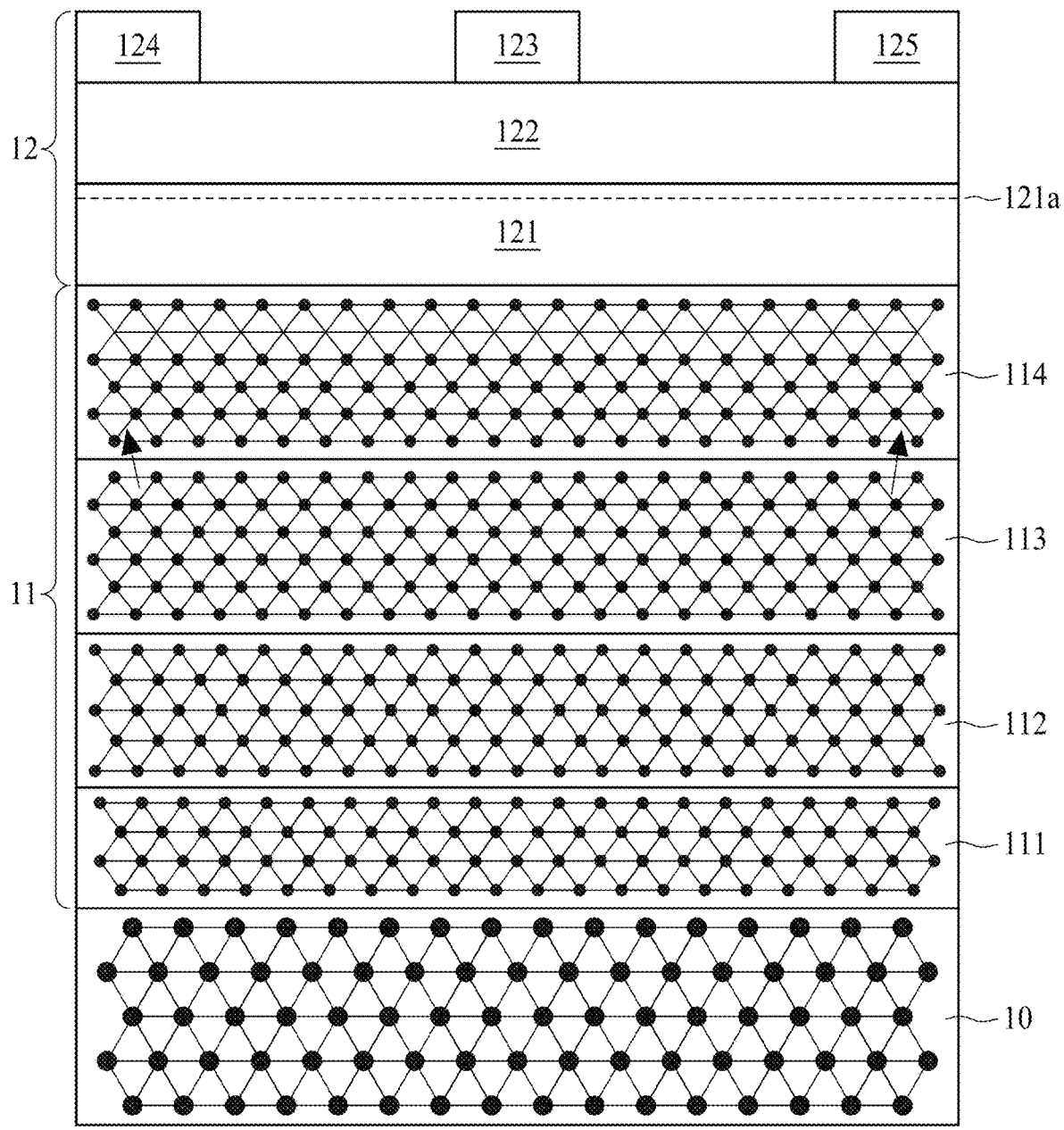
FIG. 6(b) shows the epitaxial relationships among the substrate 10 and transition layers 111-114 of the semiconductor device 500.

FIG. 6(*a*) shows a semiconductor device 500 according to an embodiment of the present invention. The semiconductor is 500 is similar to the semiconductor device 100. The difference resides in that the stack of III-nitride transition layers 11 further comprises a transition layer 114 sandwiched between the transition layer 113 and the III-nitride layer 121. As shown in FIG. 6(*b*), the transition layer 114 is disposed on the transition layer 113. The transition layer 114 is in direct contact with the transition layer 113. The transition layer 114 takes over the crystal structure of the transition layer 113. The transition layer 114 and the transition layer 113 should be of heterogeneous materials. The transition layer 114 functions to expend the underlying epilayer (see the arrows in FIG. 6(*b*)). The transition layer 114 functions to expend the overlying epilayer. Preferably, the transition layer 114 comprises $Al_zGa_{1-z}N$, where $0.4 \leq z \leq 0.8$. For example, z may be, but not limited to, 0.40, 0.42, 0.44, 0.45, 0.46, 0.48, 0.50, 0.52, 0.54, 0.55, 0.56, 0.58, 0.60, 0.62, 0.64, 0.65, 0.66, 0.68, 0.70, 0.72, 0.74, 0.75, 0.76, 0.78 or 0.80.

The transition layer 114 has a thickness less than that of the transition layer 111. The transition layer 114 has a thickness equal to that of the transition layer 111. The transition layer 114 has a thickness greater than that of the transition layer 111. The transition layer 114 has a thickness less than that of the transition layer 112. The transition layer 114 has a thickness equal to that of the transition layer 112. The transition layer 114 has a thickness greater than that of the transition layer 112. The transition layer 114 has a thickness less than that of the transition layer 113. The transition layer 114 has a thickness equal to that of the transition layer 113. The transition layer 114 has a thickness greater than that of the transition layer 113. The transition layer 114 has a thickness ranging from approximately 50 nm to approximately 300 nm. For example, the thickness of the transition layer 114 may be, but not limited to, 50, 60, 80, 100, 120, 140, 150, 160, 180, 200, 220, 240, 250, 260, 280 or 300 nm.

The transition layer 114 is single crystalline. The transition layer 114 has basic hexagonal symmetry and may be a wurtzite structure. In this connection, the transition layer 114 maintains an epitaxial relationship to the transition layer 113.

The transition layer 114 has an in-plane lattice constant less than that of the transition layer 111. The transition layer 114 has an in-plane lattice constant equal to that of the transition layer 111. The transition layer 114 has an in-plane lattice constant greater than that of the transition layer 111. The transition layer 114 has an in-plane lattice constant less than that of the transition layer 112. The transition layer 114 has an in-plane lattice constant equal to that of the transition layer 112. The transition layer 114 has an in-plane lattice constant greater than that of the transition layer 112. The transition layer 114 has an in-plane lattice constant greater than that of the transition layer 113. The transition layer 114 preferably has an in-plane lattice constant ranging from approximately 3.127 Å to approximately 3.158 Å. For example, the in-plane lattice constant of the transition layer 114 may be, but not limited to, 3.127, 3.128, 3.130, 3.132, 3.134, 3.135, 3.136, 3.138, 3.140, 3.142, 3.144, 3.145, 3.146, 3.148, 3.150, 3.152, 3.154, 3.155, 3.156 or 3.158 Å.

Since the in-plane lattice constant of the transition layer 114 is greater than that of the transition layer 113, the translation layer 114 is subject to compressive stress when grown epitaxially on the transition layer 113. Without wishing to be bound to the theory, it is believed that if the transition layer 114 is grown on the transition layer 113, the compressive stress exerted on the transition layer 114 can be up to several GPa. Surprisingly, the inventors of the present invention have found that that the compressive generated in the transition layer 114 can additionally compensates for the thermally induced tensile stress generated on returning from an elevated temperature to room temperature by the difference in TECs between the III-nitride epilayers and the substrate 10.

When the stack of III-nitride transition layers 11 additionally comprise the transition layer 114, one of the following design rules may be followed:

1. The transition layer 114 comprises $Al_zGa_{1-z}N$, where $0.4 \leq z \leq 0.8$ and has a thickness $t_{114}$ ranging from approximately 50 nm to approximately 300 nm.
2. The transition layer 114 has an in-plane lattice constant $a_{114}$ ranging from approximately 3.127 Å to approximately 3.158 Å and a thickness $t_{114}$ ranging from approximately 50 nm to approximately 300 nm.
3. The transition layer 111 comprises $Al_wGa_{1-w}N$, where $0.9 \leq w \leq 1$. The transition layer 114 comprises $Al_zGa_{1-z}N$, where $0.4 \leq z \leq 0.8$. The transition layer 111 has a thickness $t_{111}$ ranging from approximately 50 nm to approximately 300 nm. The transition layer 114 has a thickness $t_{114}$ ranging from approximately 50 nm to approximately 300 nm. In this case, $w>z$, $t_{111}<t_{114}$, $0.20 \leq w-z \leq 0.5$, $t_{111}*w \leq 200$, and $t_{114}*z \leq 200$.
4. The transition layer 111 has an in-plane lattice constant $a_{111}$ ranging from approximately 3.112 Å to approximately 3.120 Å. The transition layer 114 has an in-plane lattice constant $a_{114}$ ranging from approximately 3.127 Å to approximately 3.158 Å. The transition layer 111 has a thickness $t_{111}$ ranging from approximately 50 nm to approximately 300 nm. The transition layer 114 has a thickness $t_{114}$ ranging from approximately 50 nm to approximately 300 nm. In this case, $a_{111}<a_{114}$, $t_{111}<t_{114}$, $a_{114}-a_{111} \geq 30*(3.189-3.112)/100=0.0231$, $t_{111} \leq 200/(100-100*(a_{111}-3.112)/(3.189-3.112))$, and $t_{114} \leq 200/(100-100*(a_{114}-3.112)/(3.189-3.112))$.
5. The transition layer 112 comprises $Al_xGa_{1-x}N$, where $0.4 \leq x \leq 0.8$. The transition layer 114 comprises $Al_zGa_{1-z}N$, where $0.4 \leq z \leq 0.8$. The transition layer 112 has a thickness $t_{112}$ ranging from approximately 50 nm to approximately 300 nm. The transition layer 114 has a thickness $t_{114}$ ranging from approximately 50 nm to approximately 300 nm. In this case, $x>z$ and $t_{112}<t_{114}$, $0.20 \leq x-z \leq 0.5$, $t_{112}*x \leq 200$, and $t_{114}*z \leq 200$.
6. The transition layer 112 has an in-plane lattice constant $a_{112}$ ranging from approximately 3.127 Å to approximately 3.158 Å. The transition layer 114 has an in-plane lattice constant $a_{114}$ ranging from approximately 3.127 Å to approximately 3.158 Å. The transition layer 112 has a thickness $t_{112}$ ranging from approximately 50 nm to approximately 300 nm. The transition layer 114 has a thickness $t_{114}$ ranging from approximately 50 nm to approximately 300 nm. In this case, $a_{112}<a_{114}$, $t_{112}<t_{114}$, $a_{114}-a_{112} \geq 20*(3.189-3.112)/100=0.0154$, $t_{112} \leq 200/(100-100*(a_{112}-3.112)/(3.189-3.112))$, and $t_{114} \leq 200/(100-100*(a_{114}-3.112)/(3.189-3.112))$.
7. The transition layer 113 comprises $Al_yGa_{1-y}N$, where $0.4 \leq y \leq 0.8$. The transition layer 114 comprises $Al_zGa_{1-z}N$, where $0.4 \leq z \leq 0.8$. The transition layer 113 has a thickness $t_{113}$ ranging from approximately 50 nm to approximately 300 nm. The transition layer 114 has a thickness $t_{114}$ ranging from approximately 50 nm to approximately 300 nm. In this case, $y>z$, $t_{113}<t_{114}$, $0.20 \leq y-z \leq 0.5$, and $t_{113}*y \leq 200$, $t_{114}*z \leq 200$.
8. The transition layer 113 has an in-plane lattice constant $a_{113}$ ranging from approximately 3.127 Å to approximately 3.158 Å. The transition layer 114 has an in-plane lattice constant $a_{114}$ ranging from approximately 3.127 Å to approximately 3.158 Å. The transition layer 113 has a thickness $t_{113}$ ranging from approximately 50 nm to approximately 300 nm. The transition layer 114 has a thickness $t_{114}$ ranging from approximately 50 nm to approximately 300 nm. In this case, $a_{113}<a_{114}$ and $t_{113}<t_{114}$. The transition layer 114 may apply tensile stress to the transition layer 113 at room temperature. In this case, $a_{114}-a_{113} \geq 10*(3.189-3.112)/100=0.0077$, $t_{113} \leq 200/(100-100*(a_{113}-3.112)/(3.189-3.112))$, $t_{114} \leq 200/(100-100*(a_{114}-3.112)/(3.189-3.112))$.
9. The transition layers 112, 113 and 114 may be designed according to the proviso given in Table 3:

TABLE 3

| | Composition | | Thickness | |
|---|---|---|---|---|
| | Alloy | Relationship | Range (nm) | Relationship |
| Transition layer 112 | $Al_xGa_{1-x}N$, where $0.4 \leq x \leq 0.8$ | $z < x < y$ | $t_{112} = 50\text{-}300$ | $t_{112} < t_{113} < t_{114}$ |
| Transition layer 113 | $Al_yGa_{1-y}N$, where $0.4 \leq y \leq 0.8$ | | $t_{113} = 50\text{-}300$ | |
| Transition layer 114 | $Al_zGa_{1-z}N$, where $0.4 \leq z \leq 0.8$ | | $t_{114} = 50\text{-}300$ | |

10. The transition layers 112, 113 and 114 may be designed according to the proviso given in Table 4:

TABLE 4

| | In-plane lattice constant | | Thickness | |
|---|---|---|---|---|
| | Range (Å) | Relationship | Range (nm) | Relationship |
| Transition layer 112 | $a_{112} = 3.127\text{-}3.158$ | $a_{113} < a_{112} < a_{114}$ | $t_{112} = 50\text{-}300$ | $t_{112} < t_{113} < t_{114}$ |
| Transition layer 113 | $a_{113} = 3.127\text{-}3.158$ | | $t_{113} = 50\text{-}300$ | |
| Transition layer 114 | $a_{114} = 3.127\text{-}3.158$ | | $t_{114} = 50\text{-}300$ | |

The transition layer 113 may apply compressive stress to the transition layer 112 at room temperature. The transition layer 114 may apply tensile stress to the transition layer 113 at room temperature.

11. If the transition layer 4 is present, The transition layers 111, 113 and 114 may be designed according to the proviso given in Table 5:

TABLE 5

| | Composition | | Thickness | |
|---|---|---|---|---|
| | Alloy | Relationship | Range (nm) | Relationship |
| Transition layer 111 | $Al_wGa_{1-w}N$, where $0.9 \leq w \leq 1$ | $z < y < w$ | $t_{111} = 50\text{-}300$ | $t_{111} < t_{113} < t_{114}$ |
| Transition layer 113 | $Al_yGa_{1-y}N$, where $0.4 \leq y \leq 0.8$ | | $t_{113} = 50\text{-}300$ | |
| Transition layer 114 | $Al_zGa_{1-z}N$, where $0.4 \leq z \leq 0.8$ | | $t_{114} = 50\text{-}300$ | |

12. The transition layers 111, 113 and 114 may be designed according to the proviso given in Table 6:

TABLE 6

| | In-plane lattice constant | | Thickness | |
|---|---|---|---|---|
| | Range (Å) | Relationship | Range (nm) | Relationship |
| Transition layer 111 | $a_{111} = 3.112\text{-}3.120$ | $a_{111} < a_{113} < a_{114}$ | $t_{111} = 50\text{-}300$ | $t_{111} < t_{113} < t_{114}$ |

TABLE 6-continued

| | In-plane lattice constant | | Thickness | |
|---|---|---|---|---|
| | Range (Å) | Relationship | Range (nm) | Relationship |
| Transition layer 113 | $a_{113} = 3.127\text{-}3.158$ | | $t_{113} = 50\text{-}300$ | |
| Transition layer 114 | $a_{114} = 3.127\text{-}3.158$ | | $t_{114} = 50\text{-}300$ | |

The transition layer 114 may apply tensile stress to the transition layer 113 at room temperature.

13. The transition layers 111, 112 and 114 may be designed according to the proviso given in Table 7:

TABLE 7

| | Composition | | Thickness | |
|---|---|---|---|---|
| | Alloy | Relationship | Range (nm) | Relationship |
| Transition layer 111 | $Al_wGa_{1-w}N$, where $0.9 \le w \le 1$ | $z < x < w$ | $t_{111} = 50\text{-}300$ | $t_{111} < t_{112} < t_{114}$ |
| Transition layer 112 | $Al_xGa_{1-x}N$, where $0.4 \le x \le 0.8$ | | $t_{112} = 50\text{-}300$ | |
| Transition layer 114 | $Al_zGa_{1-z}N$, where $0.4 \le z \le 0.8$ | | $t_{114} = 50\text{-}300$ | |

14. If the transition layer 4 is present, The transition layers 111, 112 and 114 may be designed according to the proviso given in Table 8:

TABLE 8

| | In-plane lattice constant | | Thickness | |
|---|---|---|---|---|
| | Range (Å) | Relationship | Range (nm) | Relationship |
| Transition layer 111 | $a_{111} = 3.112\text{-}3.120$ | $a_{111} < a_{112} < a_{114}$ | $t_{111} = 50\text{-}300$ | $t_{111} < t_{112} < t_{114}$ |
| Transition layer 112 | $a_{112} = 3.127\text{-}3.158$ | | $t_{112} = 50\text{-}300$ | |
| Transition layer 114 | $a_{114} = 3.127\text{-}3.158$ | | $t_{114} = 50\text{-}300$ | |

The transition layer 112 may apply tensile stress to the transition layer 111 at room temperature.

15. If the transition layer 4 is present, the transition layers 111, 112, 113 and 114 may be designed according to the proviso given in Table 9:

TABLE 9

| | Composition | | Thickness | |
|---|---|---|---|---|
| | Alloy | Relationship | Range (nm) | Relationship |
| Transition layer 111 | $Al_wGa_{1-w}N$, where $0.9 \le w \le 1$ | $z < x < y < w$ | $t_{111} = 50\text{-}300$ | $t_{111} < t_{112} < t_{113} < t_{114}$ |
| Transition layer 112 | $Al_xGa_{1-x}N$, where $0.4 \le x \le 0.8$ | | $t_{112} = 50\text{-}300$ | |
| Transition layer 113 | $Al_yGa_{1-y}N$, where $0.4 \le y \le 0.8$ | | $t_{113} = 50\text{-}300$ | |
| Transition layer 114 | $Al_zGa_{1-z}N$, where $0.4 \le z \le 0.8$ | | $t_{114} = 50\text{-}300$ | |

16. If the transition layer 4 is present, the transition layers 111, 112, 113 and 114 may be designed according to the proviso given in Table 10:

TABLE 10

| | In-plane lattice constant | | Thickness | |
|---|---|---|---|---|
| | Range (Å) | Relationship | Range (nm) | Relationship |
| Transition layer 111 | $a_{111} = 3.112\text{-}3.120$ | $a_{111} < a_{113} < a_{112} < a_{114}$ | $t_{111} = 50\text{-}300$ | $t_{111} < t_{112} < t_{113} < t_{114}$ |
| Transition layer 112 | $a_{112} = 3.127\text{-}3.158$ | | $t_{112} = 50\text{-}300$ | |
| Transition layer 113 | $a_{113} = 3.127\text{-}3.158$ | | $t_{113} = 50\text{-}300$ | |
| Transition layer 114 | $a_{114} = 3.127\text{-}3.158$ | | $t_{114} = 50\text{-}300$ | |

The transition layer 112 may apply tensile stress to the transition layer 111 at room temperature. The transition layer 113 may apply compressive stress to the transition layer 112 at room temperature. The transition layer 114 may apply tensile stress to the transition layer 113 at room temperature.

Figure 7:
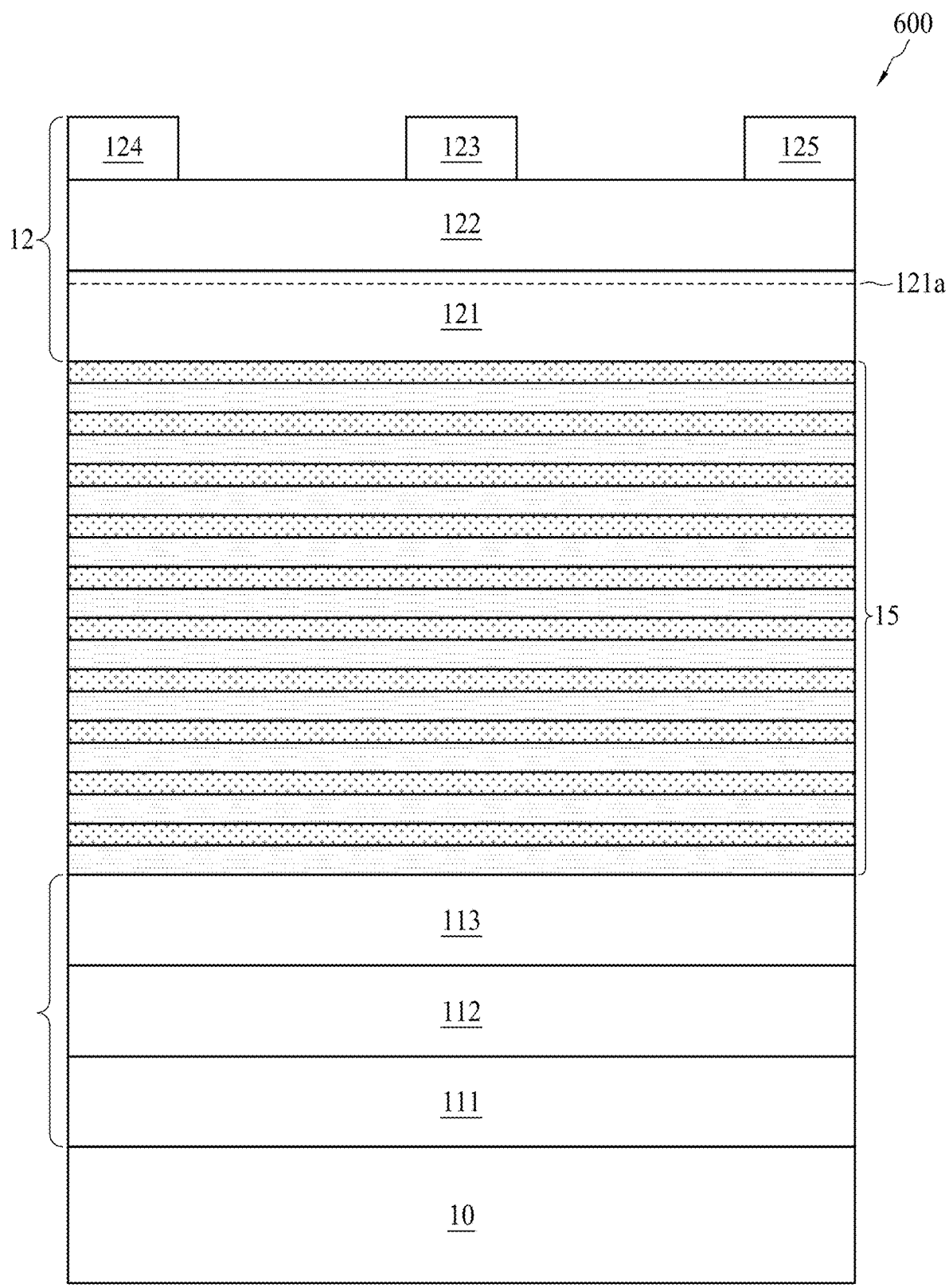
FIG. 7 shows a semiconductor device 600 according to another embodiment of the present invention.

FIG. 7 shows a semiconductor device 600 according to an embodiment of the present invention. The semiconductor is 600 is similar to the semiconductor device 100. The difference resides in that the semiconductor device 600 further comprises a superlattice 15 sandwiched between the stack of III-nitride transition layers 11 and the III-nitride heterojunction 12. The superlattice 15 may be a plurality of layers or a multi-layer stack, for example an AlGaN/GaN pair or a multi-layer stack of AlN/GaN. Thickness of the each of layers of the super lattice may be less than 20 nm, for example, but being not limited to 1, 2, 4, 5, 6, 8, 10, 12, 14, 15, 16, 18 or 20 nm.

The superlattice 15 may further compensate for the tensile stress or strain during cooling. The superlattice 15 may also prevent defects (such as dislocations or cracks) from propagating into the III-nitride layers 121 and 122 from a layer (such as the transition layers) under the superlattice 15, so as to enhance the crystallization quality to the III-nitride layers 121 and 122 and avoid the dysfunction of the semiconductor device. The superlattice 15 may trap electrons diffused from the substrate 10 to the III-nitride layer 121, thereby further improving the efficiency and reliability of the device.

In high-voltage application, in order to avoid direct breakdown of the voltage to the substrate 10, the superlattice 15 may increase the integral size of the semiconductor device or structure to increase the breakdown voltage. The total thickness of the superlattice 15 is generally about 1 μm to 4 μm, and is greater than that of the buffer layer. When the superlattice 15 is disposed, defects, such as delamination or peeling off, caused by the lattice number and/or TEC difference of the superlattice 15 from adjacent materials still need to be considered. Additionally, the manufacturing cost will be greatly increased due to use of the superlattice 15.

In high-voltage application, in order to avoid direct breakdown of the voltage to the substrate 10, the buffer layer or the superlattice 15 may be doped with other heterogeneous elements, for example, but not limited to, carbon, oxygen, or nitrogen, and they may be intentionally doped or unintentionally doped.

The composition of each of the transition layers 111-113 according to the present invention can be characterized by any conventional chemical analysis techniques, such as energy dispersive spectrometer (EDS) or electron energy loss spectroscopy (EELS) used in a TEM. The in-plan lattice constant of each of the transition layers $a_{111}$, $a_{112}$, $a_{113}$ can be detected by means of a TEM in high-resolution (HR) mode or an electron selected-area diffraction (SAD) pattern or by means of a high-resolution X-ray diffractometry (HR-XRD). The crystal orientations among the single crystalline layers in a semiconductor device also can be confirmed by means of a TEM or an HR-XRD. Specifically, the crystallinity of each of the epi layers can be confirmed by analyzing the full width at half maximum (FWHM) of the peaks in a HR-XRD ω scan spectrum; whereas the composition of each of the epi layers can be confirmed by analyzing the peaks in a HR-XRD ω-2θ scan spectrum. The thickness of each of the epilayers can be confirmed by analyzing a cross-sectional TEM image.

The present invention also provides a method of forming the semiconductor device 100. The method comprises the following steps: providing the substrate 10; forming the transition layer 111 on the substrate 10 at a temperature T1; forming the transition layer 112 on the transition layer 111 at a temperature T2; forming the transition layer 113 on the transition layer 112 at a temperature T3; forming the III-nitride layer 121 on the transition layer 113; and forming the III-nitride layer 122 having a band gap energy greater than that of the III-nitride layer 121 on the III-nitride layer 121. Preferably, the temperature T2 may be equal to or greater than the first temperature T1. The temperature difference between the temperature T1 and the temperature T2 may be about 50 to 400° C., for example, but being not limited to 50, 100, 150, 200, 250, 300, 350 or 400° C. Preferably, the temperature T3 may be equal to or greater than the temperature T1. The temperature difference between the temperature T3 and the temperature T1 may be about 50 to 400° C., for example, but being not limited to 50, 100, 150, 200, 250, 300, 350 or 400° C.

The method further comprising forming the transition layer 114 on the transition layer 113 prior to forming the III-nitride layer 121. Preferably, the transition layer 114 is preferably formed at a fourth temperature greater than the temperature T1. The temperature difference between the fourth temperature and the temperature T1 may be about 50 to 400° C., for example, but being not limited to 50, 100, 150, 200, 250, 300, 350 or 400° C.

Preferably, the transition layer 111 may be epitaxially formed on the substrate 10. The transition layer 112 may be epitaxially formed on the transition layer 111. The transition layer 113 may be epitaxially formed on the transition layer 112. The III-nitride layer 121 may be epitaxially formed on the transition layer 113. The III-nitride layer 122 may be epitaxially formed on the III-nitride layer 121. In the case that the transition layer 114 is present, the transition layer 114 may be epitaxially formed on the transition layer 113, and the III-nitride layer 121 may be epitaxially formed on the transition layer 114.

The term "epitaxy" thus particularly covers the techniques known as "metalorganic vapor phase epitaxy" (MOVPE), or metalorganic chemical vapor deposition (MOCVD), or molecular beam epitaxy (MBE), and hydride vapor phase epitaxy (HYPE). Although MOVPE epitaxy is preferred due to the industrial application thereof, all the epitaxy steps mentioned hereinafter can be implemented using each of these techniques. Optionally, some epitaxy steps are performed using one technique and other steps using another technique.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a substrate;
   a stack of III-nitride transition layers disposed on the substrate, the stack of III-nitride transition layers maintaining an epitaxial relationship to the substrate;
   a first III-nitride layer disposed on the stack of III-nitride transition layers; and
   a second III-nitride layer disposed on the first III-nitride layer, the second III-nitride layer having a band gap energy greater than that of the first III-nitride layer,
   wherein the stack of III-nitride transition layers comprises a first transition layer, a second transition layer on the first transition layer, a third transition layer on the second transition layer, and a fourth transition layer sandwiched between the third transition layer and the first III-nitride layer, and
   wherein the second transition layer has a minimum aluminium molar ratio among the first transition layer, the second transition layer and third transition layer; and the fourth transition layer has an aluminium molar ratio smaller than that of the third transition layer.

2. The semiconductor device according to claim 1, wherein the first transition layer comprises $Al_wGa_{1-w}N$, where $0.9 \leq w \leq 1$.

3. The semiconductor device according to claim 1, wherein the second transition layer comprises $Al_xGa_{1-x}N$, where $0.4 \leq x \leq 0.8$.

4. The semiconductor device according to claim 1, wherein the third transition layer comprises $Al_yGa_{1-y}N$, where $0.4 \leq y \leq 0.8$.

5. The semiconductor device according to claim 1, wherein the first transition layer has a minimum thickness among the first transition layer, the second transition layer and third transition layer.

6. The semiconductor device according to claim 1, wherein the third transition layer has a maximum thickness among the first transition layer, the second transition layer and third transition layer.

7. The semiconductor device according to Claim 1, wherein the fourth transition layer comprises $Al_zGa_{1-z}N$, where $0.4 \leq z \leq 0.8$.

8. The semiconductor device according to claim 1, wherein the second transition layer has a thickness less than one of the first transition layer and third transition layer.

9. The semiconductor device according to claim 8, wherein the second transition layer has a thickness greater than the other one of the first transition layer and third transition layer.

10. A semiconductor device, comprising:
a substrate;
a stack of III-nitride transition layers disposed on the substrate, the stack of III-nitride transition layers maintaining an epitaxial relationship to the substrate;
a first III-nitride layer disposed on the stack of III-nitride transition layers, and
a second III-nitride layer disposed on the first III-nitride layer, the second III-nitride layer having a band gap energy greater than that of the first III-nitride layer,
wherein the stack of III-nitride transition layers comprises a first transition layer, a second transition layer on the first transition layer, a third transition layer on the second transition layer, and a fourth transition layer sandwiched between the third transition layer and the first III-nitride layer, and
wherein the second transition layer has a maximum in-plane lattice constant among the first transition layer, the second transition layer and the third transition layer; and the fourth transition layer has an in-plane lattice constant greater than that of the third transition layer.

11. The semiconductor device according to claim 10, wherein the first transition layer has an in-plane lattice constant ranging from approximately 3.112 Å to approximately 3.120 Å.

12. The semiconductor device according to claim 10 wherein the second transition layer has an in-plane lattice constant ranging from approximately 3.127 Å to approximately 3.158 Å.

13. The semiconductor device according to claim 10, wherein the third transition layer has an in-plane lattice constant ranging from approximately 3.127 Å to approximately 3.158 Å.

14. The semiconductor device according to claim 10, wherein the first transition layer has a minimum thickness among the first transition layer, the second transition layer and third transition layer.

15. The semiconductor device according to claim 10, wherein the third transition layer has a maximum thickness among the first transition layer, the second transition layer and third transition layer.

16. The semiconductor device according to claim 10, wherein the second transition layer has a thickness less than one of the first transition layer and third transition layer.

17. The semiconductor device according to claim 16, wherein the second transition layer has a thickness greater than the other one of the first transition layer and third transition layer.

18. A method of forming a semiconductor device, comprising:
providing a substrate;
forming a first transition layer on the substrate at a first temperature;
forming a second transition layer on the first transition layer at a second temperature greater than the first temperature;
forming a third transition layer on the second transition layer at a third temperature greater than the first temperature;
forming a fourth transition layer on the third transition layer at a fourth temperature greater than the first temperature;
forming a first III-nitride layer on the fourth transition layer; and
forming a second III-nitride layer having a band gap energy greater than that of the first III-nitride layer on the first III-nitride layer,
wherein a fourth transition layer is sandwiched between the third transition layer and the first III-nitride layer,
wherein the second transition layer has a minimum aluminium molar ratio among the first transition layer, the second transition layer and third transition layer; and the fourth transition layer has an aluminium molar ratio smaller than that of the third transition layer.

* * * * *